(12) United States Patent
Lu

(10) Patent No.: US 12,074,205 B2
(45) Date of Patent: Aug. 27, 2024

(54) TRANSISTOR STRUCTURE AND RELATED INVERTER

(71) Applicant: Etron Technology, Inc., Hsinchu (TW)

(72) Inventor: Chao-Chun Lu, Taipei (TW)

(73) Assignees: Etron Technology, Inc., Hsinchu (TW); Invention And Collaboration Laboratory Pte. Ltd., Singapore (SG)

( * ) Notice: Subject to any disclaimer, the term of this patent is extended or adjusted under 35 U.S.C. 154(b) by 401 days.

(21) Appl. No.: 16/991,044

(22) Filed: Aug. 12, 2020

(65) Prior Publication Data

US 2021/0351272 A1 Nov. 11, 2021

Related U.S. Application Data

(60) Provisional application No. 63/021,099, filed on May 7, 2020.

(51) Int. Cl.
| | | |
|---|---|---|
| H01L 29/417 | (2006.01) | |
| H01L 21/285 | (2006.01) | |
| H01L 21/762 | (2006.01) | |
| H01L 27/092 | (2006.01) | |
| H01L 29/06 | (2006.01) | |
| H01L 29/08 | (2006.01) | |
| H01L 29/45 | (2006.01) | |
| H01L 29/66 | (2006.01) | |
| H01L 29/78 | (2006.01) | |

(52) U.S. Cl.
CPC .. *H01L 29/41766* (2013.01); *H01L 21/28518* (2013.01); *H01L 21/76224* (2013.01); *H01L 27/0921* (2013.01); *H01L 29/0653* (2013.01); *H01L 29/0847* (2013.01); *H01L 29/45* (2013.01); *H01L 29/66492* (2013.01); *H01L 29/7833* (2013.01)

(58) Field of Classification Search
CPC ........... H01L 27/0921; H01L 27/11807; H01L 21/28518; H01L 21/76224; H01L 21/823871; H01L 21/823892; H01L 21/74; H01L 29/0653; H01L 29/0847; H01L 29/41766; H01L 29/45; H01L 29/66492; H01L 29/6656; H01L 29/66636; H01L 29/78; H01L 29/7833
USPC ......................................................... 257/372
See application file for complete search history.

(56) References Cited

U.S. PATENT DOCUMENTS

2007/0018220 A1 1/2007 Lee
2009/0302392 A1 12/2009 Slesazeck
(Continued)

FOREIGN PATENT DOCUMENTS

JP 2004-140404 A 5/2004
KR 10-2007-0009303 A 1/2007
(Continued)

*Primary Examiner* — Fazli Erdem
(74) *Attorney, Agent, or Firm* — Winston Hsu

(57) ABSTRACT

A transistor structure includes a semiconductor substrate, agate structure, a channel region, and a first conductive region. The semiconductor substrate has a semiconductor surface. The channel region includes a first terminal and a second terminal. The first conductive region is electrically coupled to the first terminal of the channel region, and the first conductive region includes a first metal containing region under the semiconductor surface.

30 Claims, 22 Drawing Sheets

(56) References Cited

U.S. PATENT DOCUMENTS

| | | | | |
|---|---|---|---|---|
| 2010/0258897 A1* | 10/2010 | Lui | ...................... | H01L 29/7811 |
| | | | | 257/E29.338 |
| 2011/0068475 A1* | 3/2011 | de Fresart | ......... | H01L 21/76898 |
| | | | | 257/E23.141 |
| 2011/0084320 A1* | 4/2011 | Jung | ....................... | H01L 21/74 |
| | | | | 438/643 |
| 2012/0037983 A1* | 2/2012 | Hshieh | ................ | H01L 29/7806 |
| | | | | 257/334 |
| 2013/0168731 A1* | 7/2013 | Hsieh | ................ | H01L 29/7813 |
| | | | | 257/334 |
| 2013/0193526 A1 | 8/2013 | Lo | | |
| 2013/0320431 A1 | 12/2013 | Su | | |
| 2016/0035626 A1 | 2/2016 | Basker | | |
| 2017/0207335 A1* | 7/2017 | Lin | ...................... | H01L 29/7816 |
| 2019/0181225 A1 | 6/2019 | Lee | | |
| 2020/0006566 A1* | 1/2020 | Chien | .................... | H01L 29/792 |

FOREIGN PATENT DOCUMENTS

| | | |
|---|---|---|
| KR | 10-2013-0088704 A | 8/2013 |
| KR | 10-2014-0086945 A | 7/2014 |
| KR | 10-2019-0067585 A | 6/2019 |
| TW | 428321 | 4/2001 |

* cited by examiner

3(a)

3(b)

TRANSISTOR STRUCTURE AND RELATED INVERTER

CROSS REFERENCE TO RELATED APPLICATIONS

This application claims the benefit of U.S. Provisional Application No. 63/021,099, filed on May 7, 2020 and entitled "Merged Semiconductor-Junction & Metal-Connection Structures for Transistors to CMOS Circuits inside Silicon Substrate", the contents of which are incorporated herein by reference.

BACKGROUND OF THE INVENTION

1. Field of the Invention

The present invention relates to a transistor structure, an inverter, and a set of transistors, and particularly to a transistor structure, an inverter, and a set of transistors that can reduce complexity of the multiple layers of interconnections above a surface of a semiconductor substrate.

2. Description of the Prior Art

In best knowledge of the prior art, almost all interconnections of integrated circuits (including n-type metal oxide semiconductor (NMOS) transistors and p-type metal oxide semiconductor (PMOS) transistors) are using metal or conductive wires only above a surface of a silicon substrate. Even the silicon substrate can provide a very solid electrical ground level from a backside metal contact from the package substrate, but when a source of a transistor is required to be grounded, the source of the transistor still needs a surface-level metal contacting to the surface of the silicon substrate to connect some metal-1 wires above the surface to some metal pads which can supply potential of ground.

But, in order to deliver the potential of the ground to the silicon substrate, it is required to connect a zero volt from some metal pad through a metal wire and a contact opening to reach a diffusion area and then to the silicon substrate. That is, a large number of transistors need multiple layers of interconnections to access the potential of the ground (or supply voltage with high potential), wherein the multiple layers of interconnections are only positioned above the silicon substrate (even up to the tenth layer of very wide and thick metal interconnection through many Via's between the multiple layers of interconnections).

Therefore, for a designer of the integrated circuits, how to reduce complexity of the multiple layers of interconnections has become an important issue.

SUMMARY OF THE INVENTION

The present invention provides several structures of n-type metal oxide semiconductor (NMOS) and p-type metal oxide semiconductor (PMOS) transistors to complementary metal oxide semiconductor (CMOS) circuits (including inverters, NAND Gates, NOR Gates, static random access memories (SRAMs), cross-coupled amplifiers, and various circuit configurations) for enhancing speed performance of the CMOS circuits, reducing power and die area of the CMOS circuits, creating more and better paths of the CMOS circuits for thermal dissipation, and increasing immunities to noises associated with operations of the CMOS circuits.

The present invention could minimize a parasitic latch-up fetal problem in the CMOS circuits. In addition, the inventions disclose new design principles on how to construct various possibilities of using new NMOS and PMOS transistors on building high-efficiency circuit networks of transmitting signal paths, supplying voltage, and power sources inside and above the silicon substrate. By employing more multiple conductors under the silicon surface, much higher circuit performance with less power and noises could be achieved by generating more lower-impedance paths for more effective signal transmission and voltage/power supply to result in better efficiency and smaller die space. Therefore, present invention can reduce complexity of wirings or interconnections of the prior art design.

The present invention further enables multiple ways of constructing signal networks and supplying various voltage sources including positive, ground, and negative levels which can be directly connected to transistors, and allows interconnections to be built up at diversified paths of different geometrical widths and depths inside and above the substrate.

In addition, because the present invention utilizes a vertical metal connection from a source of a transistor to an existing power supply already provided on a substrate or well, the present invention could significantly reduce an area occupied by the transistor, increase power supply efficiency, and has higher immunity to noises. In addition, in a CMOS inverter, a central connector (core metal column, CMC) can simultaneously connect drains of an NMOS transistor and a PMOS transistor of the CMOS inverter, which could further shrink a size of the CMOS inverter excluding all unnecessary metal contacts and interconnections, minimize space required between different semiconductor junctions of the NMOS transistor and the PMOS transistor and between edges of an n-well (corresponding to the PMOS transistor) and a p-well (corresponding to the NMOS transistor), reduce a distance between the edges of the n-well and the p-well, and further diminish possibility of triggering the latch-up fetal problem in the CMOS inverter.

An embodiment of the present invention provides a transistor structure. The transistor structure includes a semiconductor substrate, a gate structure, a channel region, and a first conductive region. The semiconductor substrate has a semiconductor surface. The channel region includes a first terminal and a second terminal. The first conductive region is electrically coupled to the first terminal of the channel region, and the first conductive region includes a first metal containing region under the semiconductor surface.

According to another aspect of the invention, the first conductive region further includes a first semiconductor region under the semiconductor surface, and the first semiconductor region contacts to the first metal containing region.

According to another aspect of the invention, the first metal containing region includes a metal column.

According to another aspect of the invention, the first metal containing region further includes a silicide layer and a buffer layer, wherein the silicide layer abuts to the first semiconductor region, and the buffer layer contacts to the silicide layer and the metal column.

According to another aspect of the invention, the transistor structure further includes a guard isolation layer, wherein the guard isolation layer contacts to the first metal containing region, and the guard isolation layer prevents the first metal containing region from contacting to the semiconductor substrate.

According to another aspect of the invention, the guard isolation layer contacts to a bottom of the first metal containing region.

According to another aspect of the invention, the transistor structure further includes a trench isolation layer, wherein the trench isolation layer is below the semiconductor surface, and the trench isolation layer covers a plurality of sidewalls of the first metal containing region.

According to another aspect of the invention, the transistor structure further includes a second conductive region electrically coupled to the second terminal of the channel region, wherein the second conductive region includes a second metal containing region and a second semiconductor region. The second metal containing region is under the semiconductor surface, the second semiconductor region is under the semiconductor surface, and the second semiconductor region contacts to the second metal containing region.

According to another aspect of the invention, the transistor structure further includes a guard isolation layer contacting to the second metal containing region, wherein the guard isolation layer prevents the second metal containing region from contacting to the semiconductor substrate. The guard isolation layer includes a horizontal guard isolation portion and a vertical guard isolation portion, wherein the horizontal guard isolation portion contacts to a bottom of the second metal containing region, and the vertical guard isolation portion contacts to a sidewall of the second metal containing region. The vertical guard isolation portion further contacts to a bottom of the second semiconductor region.

According to another aspect of the invention, the second metal containing region contacts to the semiconductor substrate.

According to another aspect of the invention, the first semiconductor region is a first heavily doped n-type semiconductor region. A spacer covers a sidewall of the gate structure, wherein the channel region includes a first n-type lighted-doped region under the spacer, and the first n-type lighted-doped region abuts to the first heavily doped n-type semiconductor region.

According to another aspect of the invention, the first semiconductor region is a first heavily doped p-type semiconductor region. A spacer covers a sidewall of the gate structure, wherein the channel region comprises a first p-type lighted-doped-region under the spacer, and the first p-type lighted-doped-region abuts to the first heavily doped p-type semiconductor region.

Another embodiment of the present invention provides a transistor structure. The transistor structure includes a semiconductor substrate, a first concave, a second concave, a gate structure, a channel region, a first conductive region, and a second conductive region. The semiconductor substrate has a semiconductor surface. The first concave and the second concave are formed in the semiconductor substrate. The channel region includes a first terminal and a second terminal. The first conductive region is coupled to the first terminal of the channel region, the first conductive region includes a first metal containing region in the first concave and a first heavily doped semiconductor region in the first concave. The second conductive region is coupled to the second terminal of the channel region, the second conductive region includes a second metal containing region in the second concave and a second heavily doped semiconductor region in the second concave.

According to another aspect of the invention, the transistor structure further includes a first guard isolation layer and a second guard isolation layer. The first guard isolation layer contacts to a bottom of the first metal containing region and prevents the first metal containing region from contacting the semiconductor substrate. The second guard isolation layer contacts to a bottom of the second metal containing region and prevents the second metal containing region from contacting the semiconductor substrate.

According to another aspect of the invention, the transistor structure further includes a first guard isolation layer. The first guard isolation layer contacts to a bottom of the first metal containing region and prevents the first metal containing region from contacting the semiconductor substrate, wherein the second metal containing region contacts to the semiconductor substrate.

Another embodiment of the present invention provides an inverter. The inverter includes a semiconductor substrate, a first concave, a second concave, a third concave, an NMOS transistor structure, and a PMOS transistor structure. The semiconductor substrate has a semiconductor surface. The first concave, the second concave, and the third concave surface are under the semiconductor surface. The NMOS transistor structure includes a gate structure, a first conductive region, and a second conductive region. The first conductive region includes a first metal containing region in the first concave and a first heavily doped n-type semiconductor region in the first concave. The second conductive region includes a second metal containing region in the second concave and a second heavily doped n-type semiconductor region in the second concave. The PMOS transistor structure includes a gate structure, a third conductive region, and a fourth conductive region. The third conductive region includes a third heavily doped p-type semiconductor region in the first concave. The fourth conductive region includes a fourth metal containing region in the third concave and a fourth heavily doped p-type semiconductor region in the third concave. The first metal containing region is electrically coupled to the first heavily doped n-type semiconductor region and electrically coupled to the third heavily doped p-type semiconductor region.

According to another aspect of the invention, the inverter further includes a first guard isolation layer formed in the first concave, the first guard isolation layer contacts to a bottom of the first heavily doped n-type semiconductor region and a bottom of the third heavily doped p-type semiconductor region. The first guard isolation layer contacts to a bottom of the first metal containing region and contacts to a sidewall of the first metal containing region.

According to another aspect of the invention, the inverter further includes a second guard isolation layer formed in the second concave and a third guard isolation layer formed in the third concave. The second guard isolation layer contacts to a sidewall of the second metal containing region, and the second guard isolation layer further contacts to a bottom of the second heavily doped n-type semiconductor region. The third guard isolation layer contacts to a sidewall of the fourth metal containing region, and further contacts to a bottom of the fourth heavily doped p-type semiconductor region. The semiconductor substrate includes a p-well and an n-well, the second heavily doped n-type semiconductor region abuts to the p-well, and the fourth heavily doped p-type semiconductor region abuts to the n-well.

According to another aspect of the invention, the semiconductor substrate includes a p-well and an n-well, the fourth metal containing region is electrically coupled to a high voltage source through the n-well, and the second metal containing region is electrically coupled to a low voltage source through the p-well.

According to another aspect of the invention, the inverter further includes a fifth heavily doped n-type semiconductor region and a sixth heavily doped p-type semiconductor region. The fifth heavily doped n-type semiconductor region is formed in the third concave and contacts to the fourth metal containing region. The sixth heavily doped p-type semiconductor region is formed in the second concave and contacts to the second metal containing region. A high voltage source contacts to the fifth heavily doped n-type semiconductor region, and a low voltage source contacts to the sixth heavily doped p-type semiconductor region.

Another embodiment of the present invention provides a set of transistors. The set of transistors includes a semiconductor substrate, a first concave, a second concave, a third concave, a first transistor structure, and a second transistor structure. The semiconductor substrate has a semiconductor surface. The first concave, the second concave, and the third concave surface are under the semiconductor surface. The first transistor structure includes a gate structure, a first conductive region, and a second conductive region. The first conductive region includes a first metal containing region in the first concave and a first heavily doped semiconductor region in the first concave. The second conductive region includes a second metal containing region in the second concave and a second heavily doped semiconductor region in the second concave. The second transistor structure includes a gate structure, a third conductive region, and a fourth conductive region. The third conductive region includes a third heavily doped semiconductor region in the first concave. The fourth conductive region includes a fourth metal containing region in the third concave and a fourth heavily doped semiconductor region in the third concave. The first metal containing region is electrically coupled to the first heavily doped semiconductor region and electrically coupled to the third heavily doped semiconductor region.

According to another aspect of the invention, the set of transistors further includes a first guard isolation layer configured in the first concave and contacting to the first metal containing region, wherein the first guard isolation layer prevents the first metal containing region from contacting the semiconductor substrate.

According to another aspect of the invention, the second metal containing region contacts to the semiconductor substrate, and the fourth metal containing region contacts to the semiconductor substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

DETAILED DESCRIPTION (1) Two New Structures of Single N-Type Metal Oxide Semiconductor (NMOS) Transistor and Single P-Type Metal Oxide Semiconductor (PMOS) Transistor Please refer to FIG. 1. FIG. 1 is a diagram illustrating a cross section of an NMOS transistor 100 according to a first embodiment of the present invention. As shown in FIG. 1, the NMOS transistor 100 includes a p-type substrate 102, spacers 1061, 1062, a channel region 108, a gate structure 111, a first conductive region 118, a second conductive region 120, and a trench isolation layer 125 (that is, a deep shallow trench isolation structure), wherein the p-type substrate 102 can be a silicon substrate or III-V group substrate, the NMOS transistor 100 can be a tri-gate transistor, FinFET (fin field-Effect transistor), GAA (Gate-All-Around) FET, fin-structure transistor, or other type transistor, and the p-type substrate 102 could be connected to ground GND. In addition, the spacer 1061 includes an oxide-1 spacer layer 10612, and a Nitride-1 spacer layer 10614, and the spacer 1062 includes an oxide-1 spacer layer 10622, and a Nitride-1 spacer layer 10624. But, the spacers 1061, 1062 are not limited to including the above-mentioned two-layer structure, that is, the spacers 1061, 1062 can include a three-layer structure or other multiple-layer structures. As shown in FIG. 1, the spacers 1061, 1062 cover sidewalls of the gate structure 111.

Figure 1:
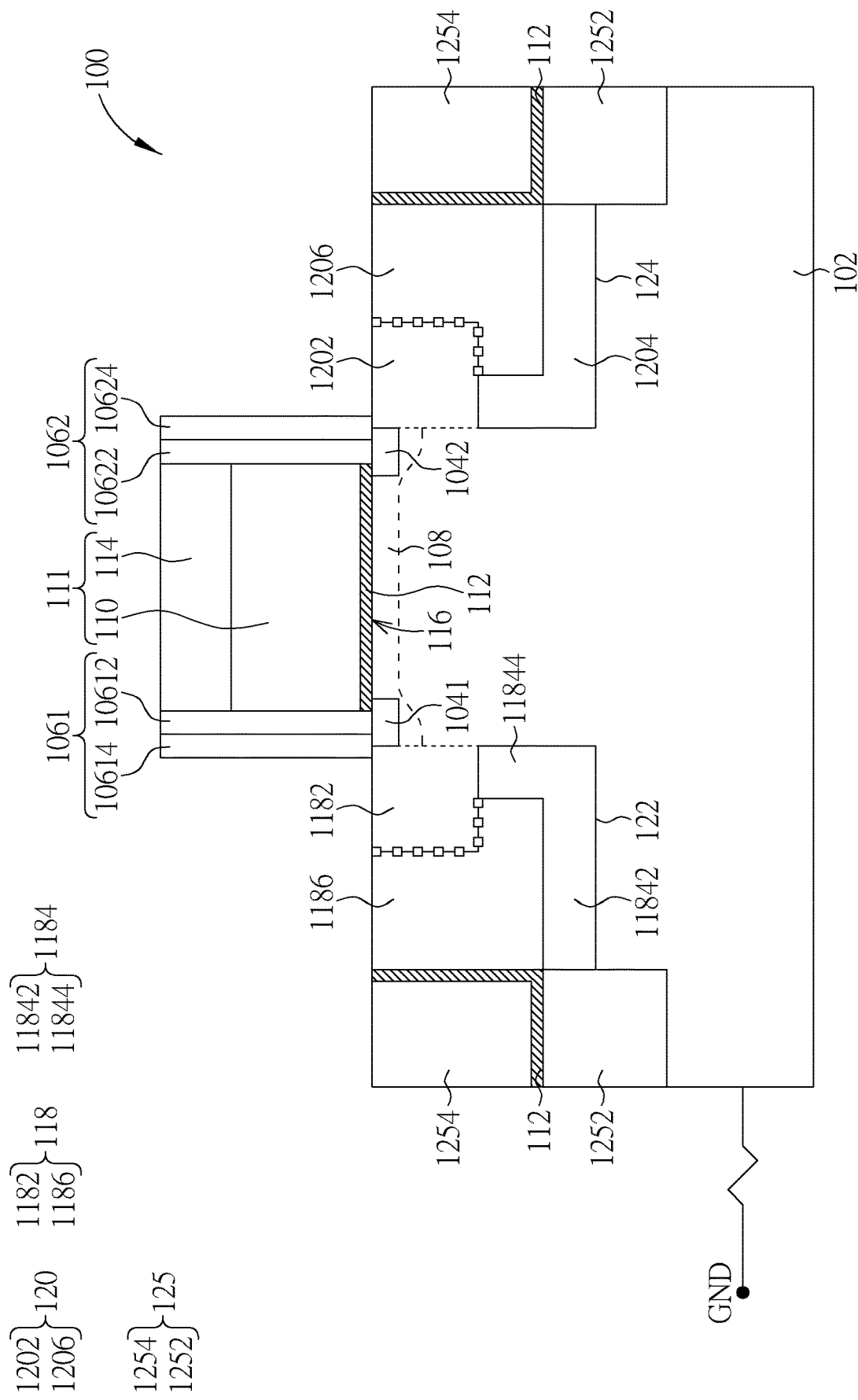
FIG. 1 is a diagram illustrating a cross section of an NMOS transistor according to a first embodiment of the present invention.

In addition, as shown in FIG. 1, the channel Region 108 is under a gate layer 110 of the gate structure 111 and a dielectric insulator 112, wherein the channel Region 108 includes n-type lightly Doped drains (NLDD) 1041, 1042, the NLDDs 1041, 1042 are formed under the spacers 1061, 1062 respectively, and the NLDDs 1041, 1042 are coupled or abutted to a first semiconductor region (which could be a first heavily doped n-type semiconductor region) 1182 and a second semiconductor region (which could be a second heavily doped n-type semiconductor region) 1202, respectively. In addition, an operational principle of the NLDDs 1041, 1042 is well-known to one of ordinary skill in the art, so further description thereof is omitted for simplicity.

In addition, as shown in FIG. 1, the gate structure 111 includes the gate layer 110 and a nitride layer 114 (that is, a nitride cap), the gate layer 110 could be a metal containing material (that is, the gate layer 110 can be a metal gate) or a poly-silicon material. The nitride layer 114 is formed above the gate layer 110, the gate layer 110 is formed above the dielectric insulator 112, the dielectric insulator 112 is formed above a semiconductor surface 116 of the p-type substrate 102, and the dielectric insulator 112 can be a high-k material.

As shown in FIG. 1, the first conductive region 118 and the second conductive region 120 are formed in a first concave 122 and a second concave 124, respectively, wherein the first conductive region 118 and the second conductive region 120 are merged semiconductor-junction and metal-connection (MSMC) structures. As shown in FIG. 1, the first conductive region 118 is electrically coupled to a first terminal of the channel region 108 and includes the first semiconductor region 1182 and a first metal containing region 1186, wherein the first semiconductor region 1182 is an n+ doped silicon drain/source layer (SDSL), and contacts to the first metal containing region 1186. The first metal containing region 1186 comprises a core metal column (CMC), and in one embodiment can comprise a composite metal material (CMM), wherein the composite metal material could include a silicide material covering the first semiconductor region 1182, a TiN buffer layer providing good interface with the silicide material, and a Tungsten layer filling in the first concave 122. The first metal containing region 1186 can act as a major connection path which has a high-conductance ohmic contact to the first semiconductor region 1182 and also act as the major metal contact region to drain/source of the NMOS transistor 100.

In addition, a first guard isolation layer 1184 is formed in the first concave 122. The first guard isolation layer 1184 could be an oxide guard layer (OGL), and as shown in FIG. 1, the first guard isolation layer 1184 is formed adjacent to the p-type substrate 102, below the first semiconductor region 1182 and/or the first metal containing region 1186, and positioned on a sidewall and a bottom of the first concave 122, wherein the first guard isolation layer 1184 in one embodiment includes a horizontal guard isolation portion 11842 and a vertical guard isolation portion 11844, the horizontal guard isolation portion 11842 further contacts to a bottom of the first metal containing region 1186, and the vertical guard isolation portion 11844 further contacts to a sidewall of the first metal containing region 1186 and a bottom of the first semiconductor region 1182. In addition, as shown in FIG. 1, because the first guard isolation layer 1184 includes the horizontal guard isolation portion 11842 and the vertical guard isolation portion 11844, the first guard isolation layer 1184 can prevent the first metal containing region 1186 from directly contacting to the p-type substrate 102, that is, the first guard isolation layer 1184 can reduce the current leakage from the first metal containing region 1186 to the p-type substrate 102.

Furthermore, as shown in FIG. 1, the second conductive region 120 is electrically coupled to a second terminal of the channel region 108 and includes the second semiconductor region 1202 and a second metal containing region 1206. In addition, a second guard isolation layer 1204 is formed in the second concave 124. The operational principles of the second semiconductor region 1202, the second guard isolation layer 1204, and the second metal containing region 1206 can be referred to operational principles of the first semiconductor region 1182, the first guard isolation layer 1184, and the first metal containing region 1186, so further description thereof is omitted for simplicity.

Figure 2A:
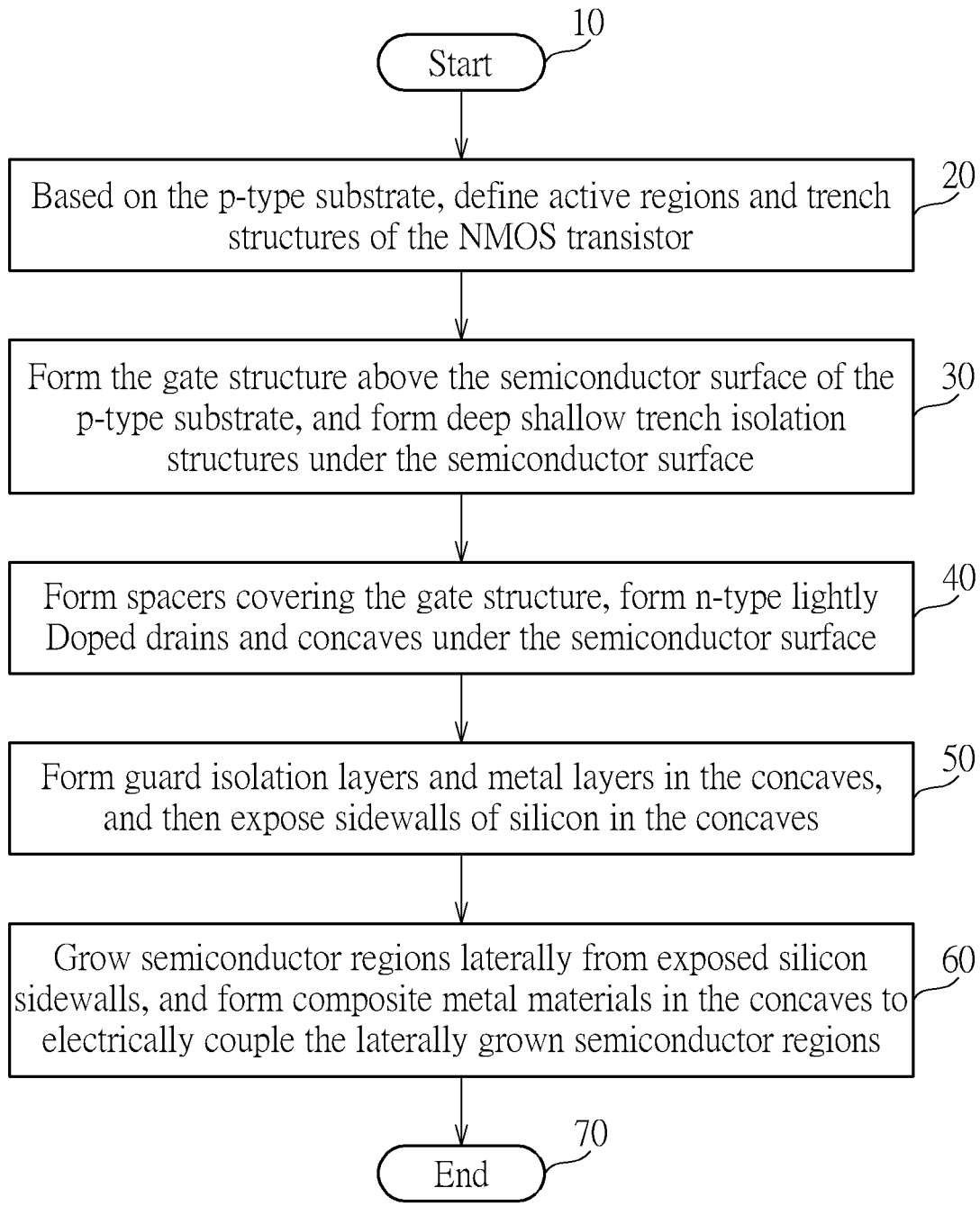
FIG. 2A is a flowchart illustrating a manufacturing method of the NMOS transistor according to a second embodiment of the present invention.

Please refer to FIGS. 2A-2F, 3-6. The manufacturing method of the NMOS transistor 100 in FIG. 2A is illustrated as follows:

Step 10: Start.

Step 20: Based on the p-type substrate, define active regions and trench structures of the NMOS transistor 100.

Step 30: Form the gate structure above the semiconductor surface of the p-type substrate, and form deep shallow trench isolation structures under the semiconductor surface.

Step 40: Form spacers covering the gate structure, form n-type lightly Doped drains (NLDD) and concaves under the semiconductor surface.

Step 50: Form guard isolation layers and metal layers in the concaves, and then expose sidewalls of silicon in the concaves.

Step 60: Grow semiconductor regions laterally from exposed silicon sidewalls, and form composite metal materials (CMM) in the concaves to electrically couple the laterally grown semiconductor regions, such that the merged semiconductor-junction and metal-connection (MSMC) structures are completed.

Step 70: End.

Figure 2B:
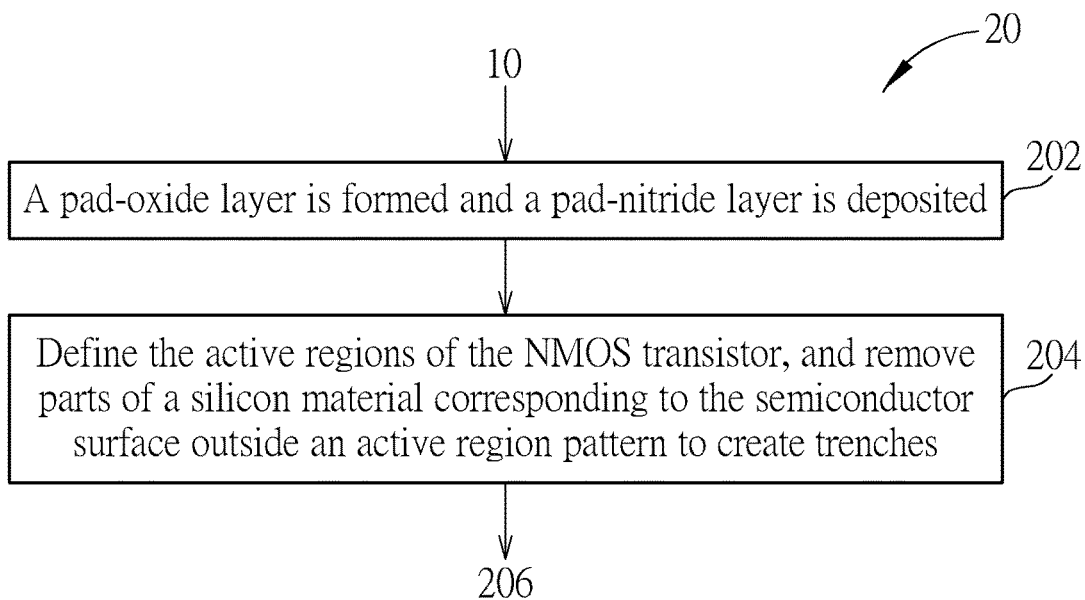
FIGS. 2B-2F are diagrams illustrating FIG. 2A.
Figure 3:
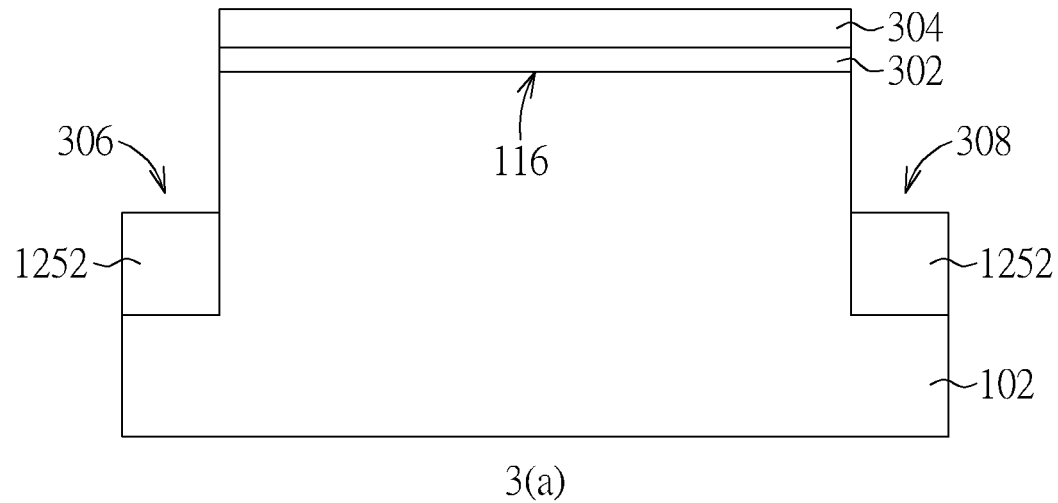
FIG. 3 is a diagram illustrating a top view and a cross-section view along a cut line (X-axis) after the pad-nitride layer is deposited and the STI is formed.
Figure 3:
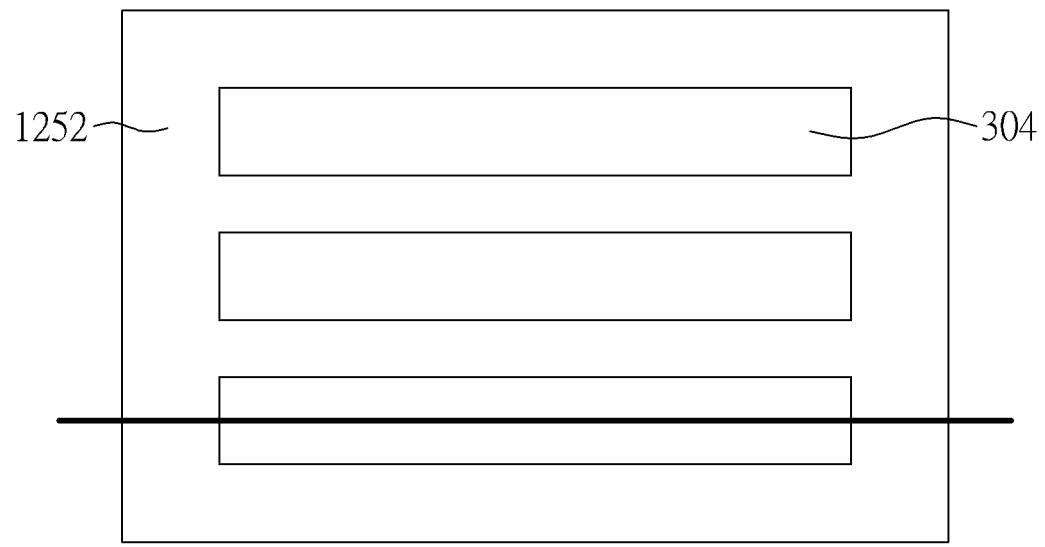

Please refer to FIG. 2B and FIG. 3. Step 20 could include:

Step 202: A pad-oxide layer 302 is formed and a pad-nitride layer 304 is deposited.

Step 204: Define the active regions of the NMOS transistor 100, and remove parts of a silicon material corresponding to the semiconductor surface 116 outside an active region pattern to create trenches 306, 308.

Figure 2C:
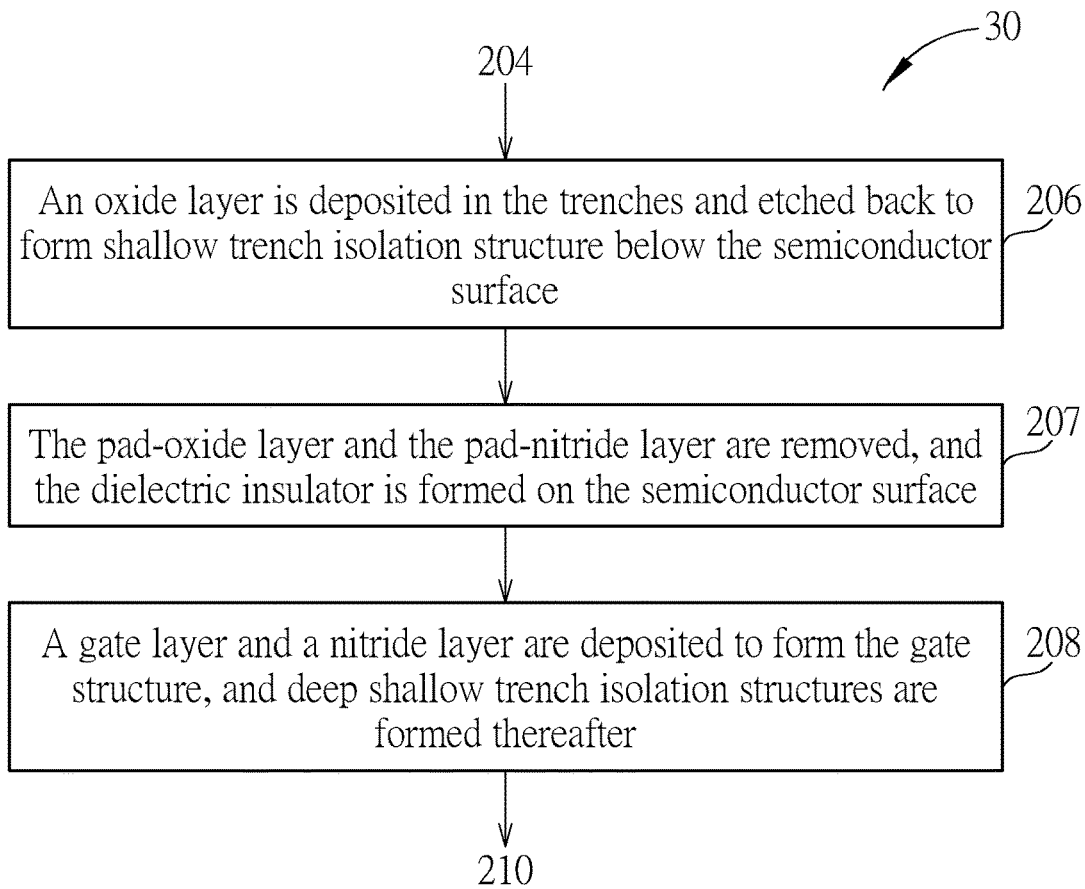
Figure 4:
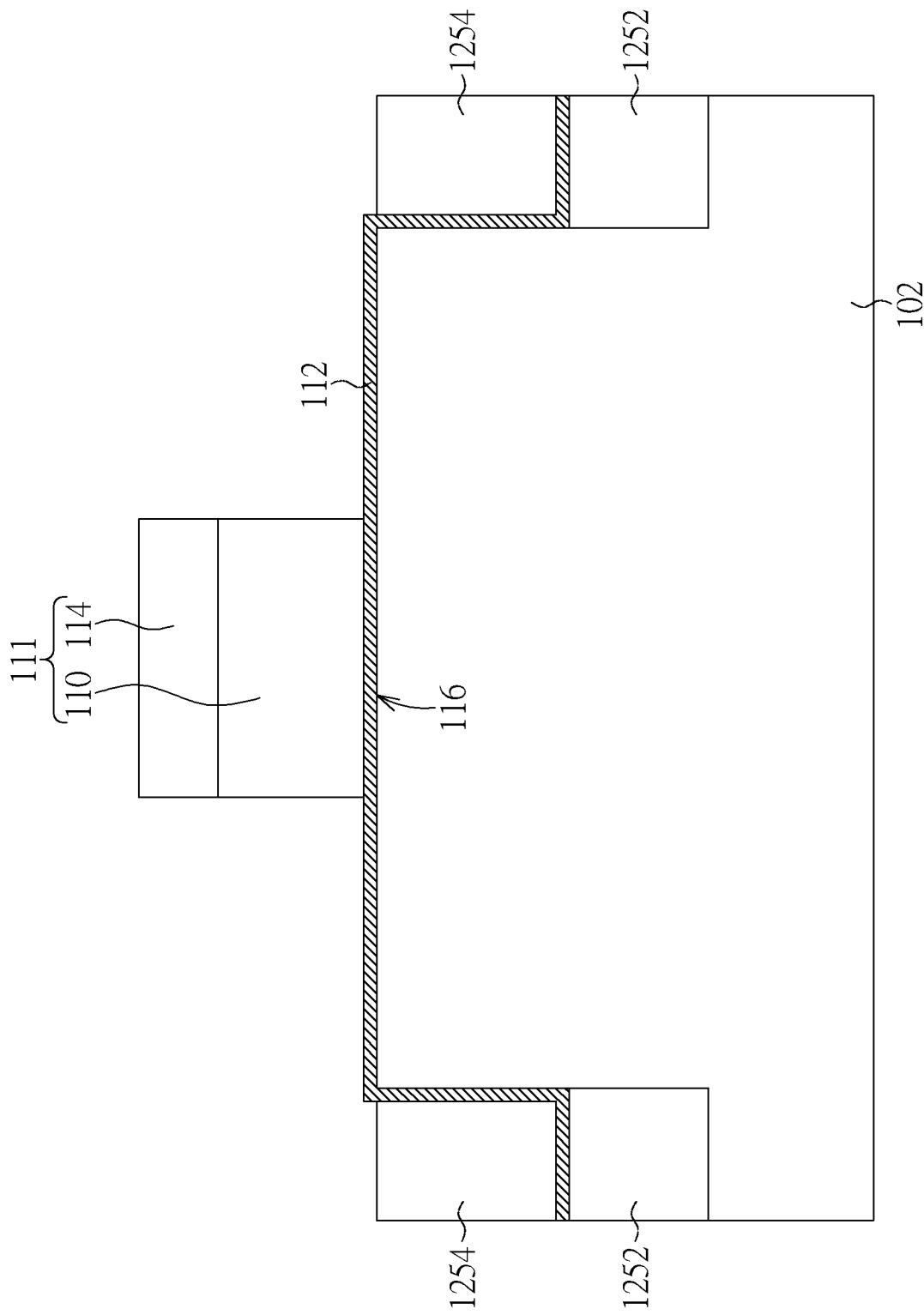
FIG. 4 is a diagram illustrating removing the pad-oxide layer and the pad-nitride layer on the active region pattern, forming the dielectric insulator on the semiconductor surface, and forming deep oxide isolation.

Please refer to FIG. 2C and FIGS. 3-4. Step 30 could include:

Step 206: An oxide layer 1252 is deposited in the trenches 306, 308 and etched back to form shallow trench isolation (STI) structure below the semiconductor surface 116.

Step 207: The pad-oxide layer 302 and the pad-nitride layer 304 are removed, and the dielectric insulator 112 is formed on the semiconductor surface 116.

Step 208: A gate layer 110 and a nitride layer 114 are deposited to form the gate structure 111, and deep shallow trench isolation structures (the trench isolation layer 125) are formed thereafter.

Figures 2D, 2E, 2F:
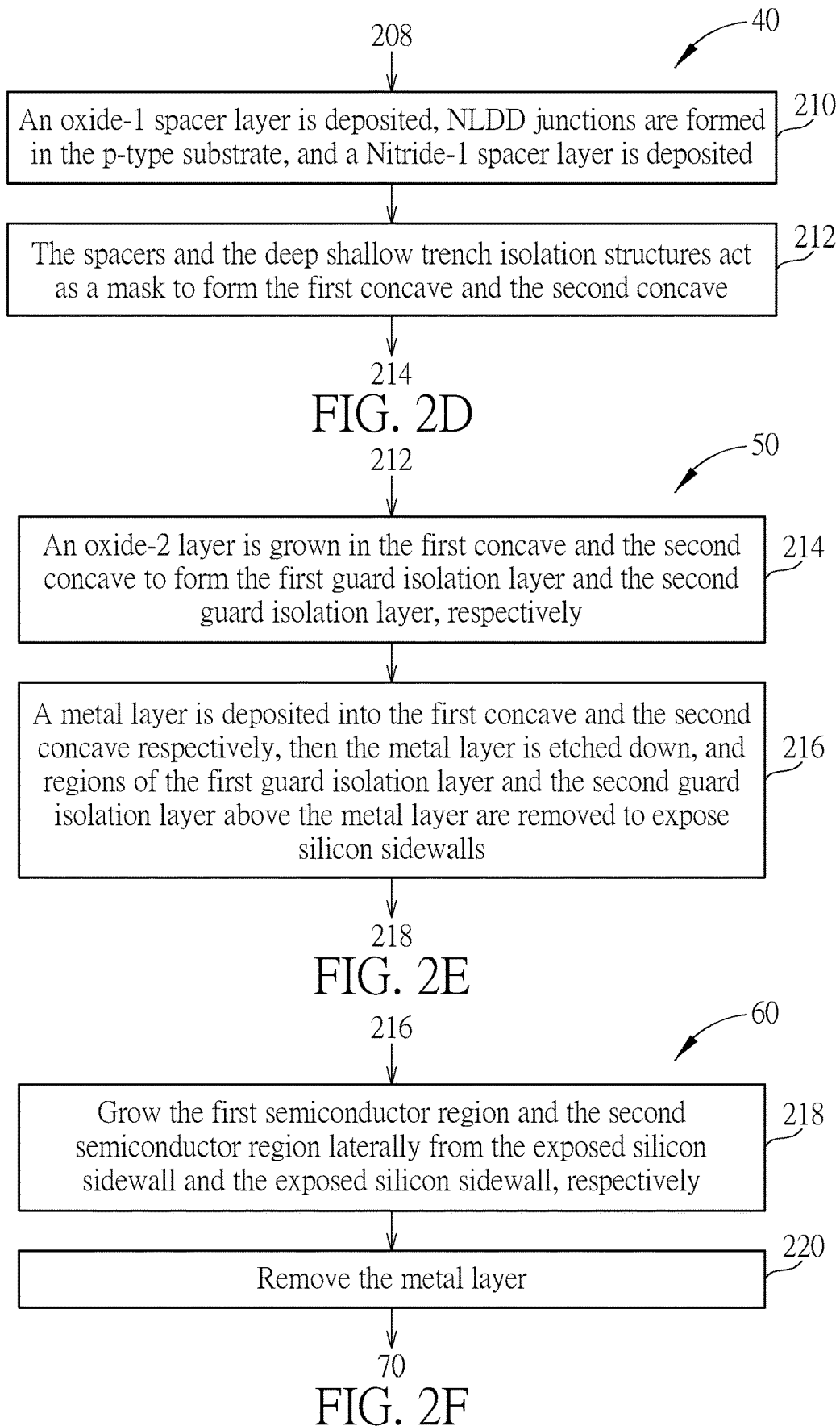
Figure 5:
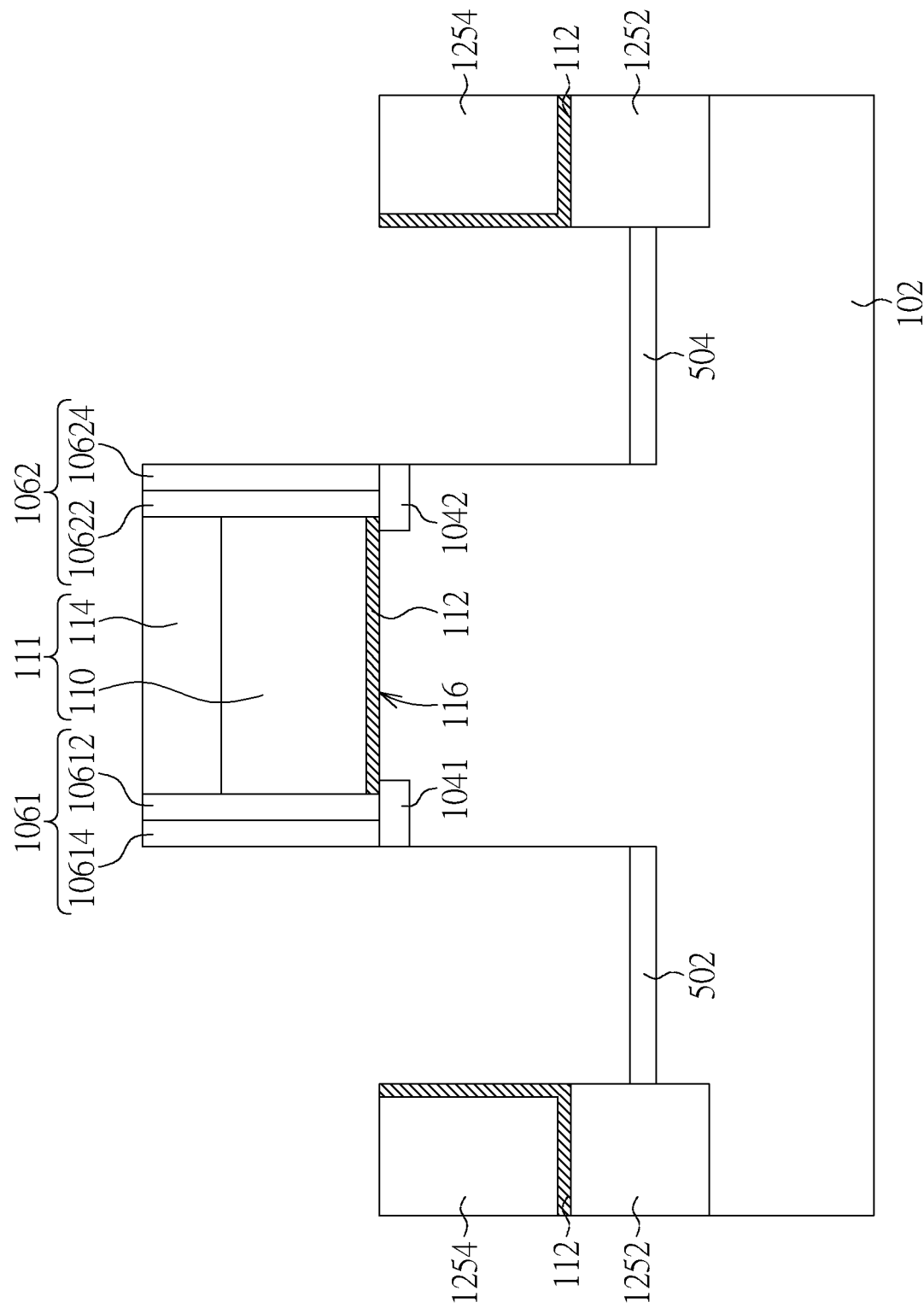
FIG. 5 is a diagram illustrating forming the spacer and the NLDD.

Please refer to FIG. 2D and FIG. 5. Step 40 could include:

Step 210: An oxide-1 spacer layer (the oxide-1 spacer layer 10612 and the oxide-1 spacer layer 10622) is deposited, NLDD junctions are formed in the p-type substrate 102, and a Nitride-1 spacer layer (the Nitride-1 spacer layer 10614 and the Nitride-1 spacer layer 10624) is deposited.

Step 212: The spacers 1061, 1062 and the deep shallow trench isolation structures (the trench isolation layer 125) act as a mask to form the first concave 122 and the second concave 124. If necessary, p+ zones 502, 504 on bottoms of the first concave 122 and the second concave 124 could be formed respectively.

Please refer to FIG. 2E and FIG. 6. Step 50 could include:

Step 214: An oxide-2 layer is grown in the first concave 122 and the second concave 124 to form the first guard isolation layer 1184 and the second guard isolation layer 1204, respectively.

Step 216: A metal layer 602 is deposited into the first concave 122 and the second concave 124 respectively, then the metal layer 602 is etched down, and regions of the first guard isolation layer 1184 and the second guard isolation layer 1204 above the metal layer 602 are removed to expose silicon sidewalls 702, 704.

Please refer to FIG. 2F and FIG. 7. Step 60 could include:

Step 218: Grow the first semiconductor region 1182 and the second semiconductor region 1202 laterally from the exposed silicon sidewall 702 and the exposed silicon sidewall 704, respectively.

Step 220: Remove the metal layer 602. A composite metal material (CMM) is deposited into the first concave 122 and the second concave 124. In one embodiment, the composite metal material may include a silicide material covering the first/second semiconductor regions 1182/1202, a TiN buffer layer providing good interface with the silicide material, and a Tungsten layer filling in the first/second concaves 122/124.

Detailed description of the aforesaid method is as follows. Start with a p-type silicon wafer (i.e. the p-type substrate 102). In Step 202, as shown in FIG. 3(*a*), the pad-oxide layer 302 is formed above the semiconductor surface 116 and then the pad-nitride layer 304 is deposited above the thin pad-oxide layer 302.

In Step 204, the active regions of the NMOS transistor 100 can be defined by a photolithographic masking technique and the active region pattern, wherein the semiconductor surface 116 outside the active region pattern is exposed accordingly. Because the semiconductor surface 116 outside the active region pattern is exposed, the parts of a silicon material corresponding to the semiconductor surface 116 outside the active region pattern can be removed by an anisotropic etching technique to create the trenches 306, 308.

In Step 206, the oxide layer 1252 is first deposited to fully fill the trenches 306, 308 and the oxide layer 1252 is etched back such that the oxide layer 1252 is below the semiconductor surface 116. In addition, FIG. 3(*b*) is a top view corresponding to FIG. 3(*a*). As shown in FIG. 4, then in Step 207, the pad-oxide layer 302 and the pad-nitride layer 304 on the active region pattern are removed. Then, the dielectric insulator 112 is formed on the semiconductor surface 116.

In Step 208, as shown in FIG. 4, the gate layer 110 is deposited above the dielectric insulator 112, and the nitride layer 114 with a well-designed thickness is deposited above the gate layer 110. Then the photolithographic masking technique and a pattern corresponding to the gate structure 111 are utilized to define the gate structure 111, the anisotropic etching technique is utilized to etch the gate layer 110 and the nitride layer outside the pattern corresponding to the gate structure 111, and photoresist corresponding to the pattern of the gate structure 111 is removed, wherein in one embodiment the gate layer 110 could be metal containing material, so the gate layer 110 can deliver required work-function of MIS (metal insulator to substrate) for achieving a suitable threshold voltage of the NMOS transistor 100. In addition, because the oxide layer 1252 is made below the semiconductor surface 116, the tri-gate or FinFET structure has been formed in this embodiment. Of course, the present invention could be applied to other transistor structures, such as planar transistor. Then, an oxide layer 1254 with enough thickness is deposited to fill in vacancies on the trenches 306, 308 and use a chemical and mechanical polishing (CMP) and/or an etch-back technique to planarize the oxide layer 1254 to a top of the semiconductor surface 116 or a top of the dielectric insulator 112, wherein both the oxide layer 1252 and the oxide layer 1254 form the trench isolation layer 125 which is also called the deep shallow trench isolation structures (or just called deep oxide isolation "DOI").

In Step 210, as shown in FIG. 5, the oxide-1 spacer layer is deposited and etched to form the oxide-1 spacer layer 10612 of the spacer 1061 and the oxide-1 spacer layer 10622 of the spacer 1062, wherein the oxide-1 spacer layer 10612 and oxide-1 spacer layer 10622 cover the sidewalls of the gate structure 111. Then, the lighted doped zones are formed in the p-type substrate 102 and rapid thermal annealing (RTA) is performed on the lighted doped zones to form the n-type lightly Doped drains (NLDDs) 1041, 1042. The Nitride-1 spacer layer (the Nitride-1 spacer layer 10614 and the Nitride-1 spacer layer 10624) is deposited and etched to form the Nitride-1 spacer layer 10614 of the spacer 1061 and the Nitride-1 spacer layer 10624 of the spacer 1062, wherein the Nitride-1 spacer layer 10614 and the Nitride-1 spacer layer 10624 cover the oxide-1 spacer layer 10612 and oxide-1 spacer layer 10622, respectively.

In Step 212, as shown in FIG. 5, the spacers 1061, 1062 and the deep shallow trench isolation structures (the trench isolation layer 125) can act as the mask, wherein the dielectric insulator 112 not covered by the mask can be removed to expose the semiconductor surface 116 to define the first conductive region 118 and the second conductive region 120. Then, silicon materials corresponding to definition regions of the first conductive region 118 and the second conductive region 120 can be etched down from the semiconductor surface 116 by the anisotropic etching technique to form the first concave 122 and the second concave 124. Optionally, in another embodiment of the present invention, for ohmic contact purpose, it is possible to use ion-implantation to form the p+ zones 502, 504 on the bottoms of the first concave 122 and the second concave 124, respectively.

Figure 6A:
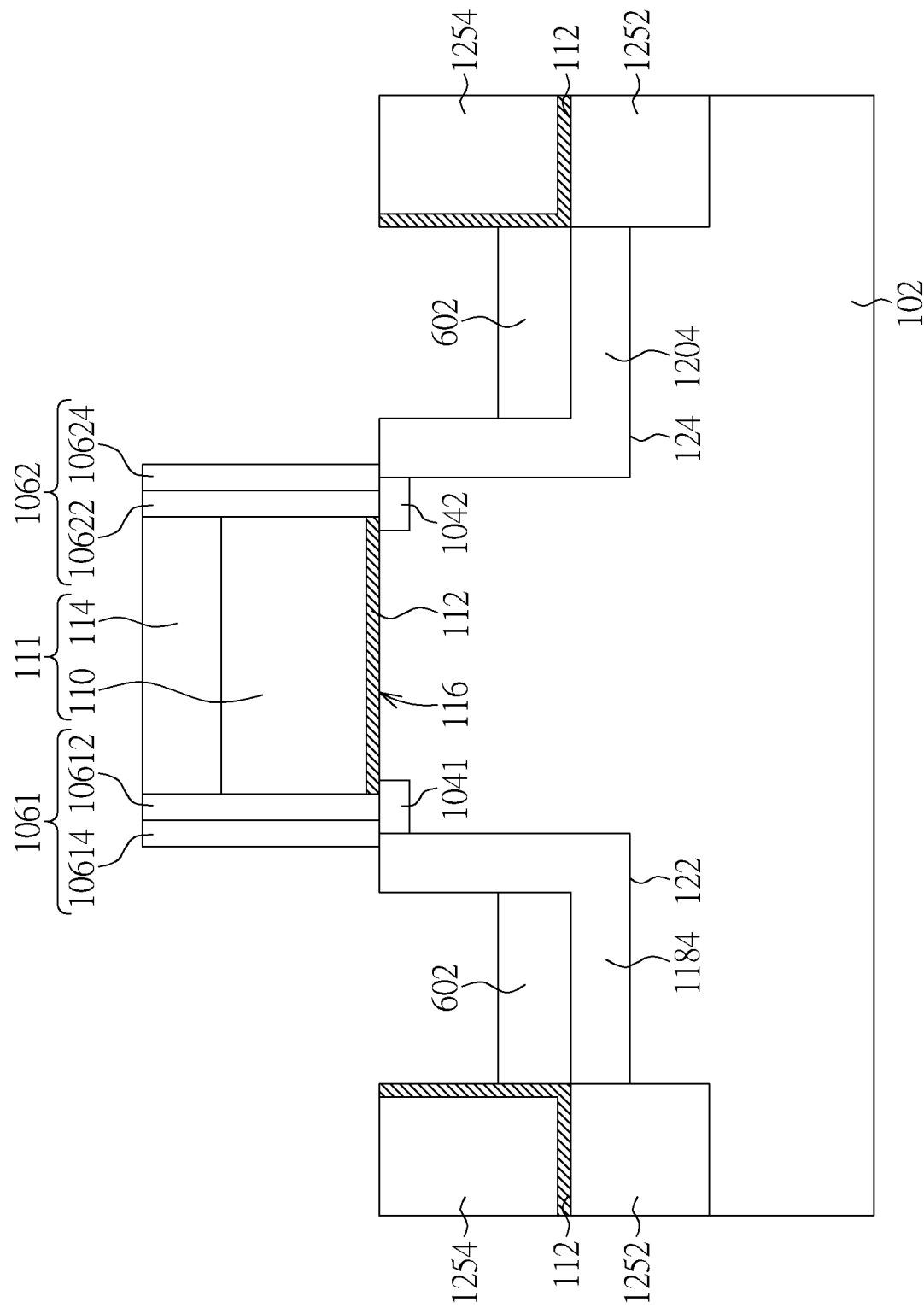
FIG. 6A is a diagram illustrating forming the first guard isolation layer and the second guard isolation layer, depositing the metal layer (Tungsten-1) into the first concave and the second concave respectively, and etching down the metal layer.
Figure 6B:
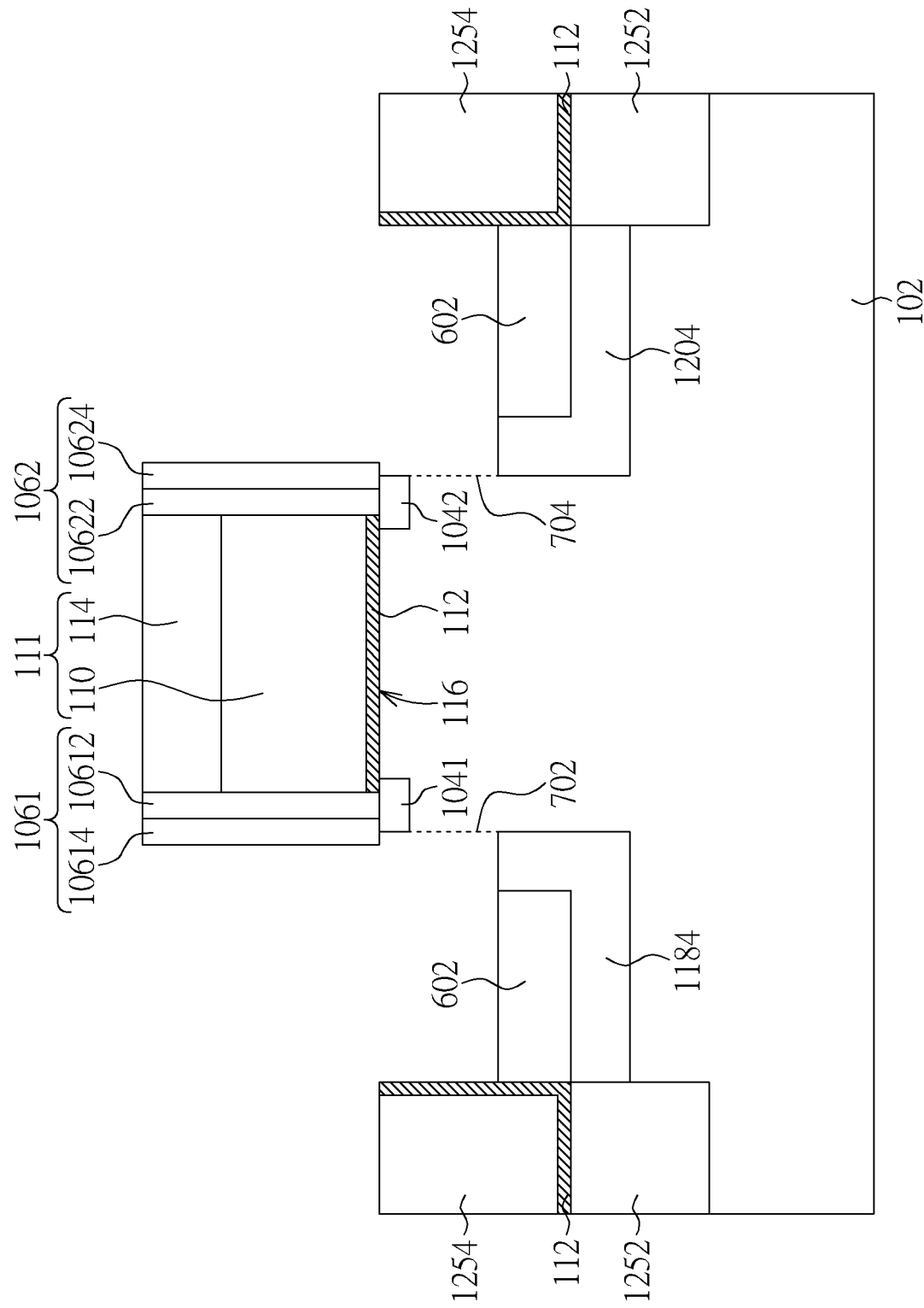
FIG. 6B is a diagram illustrating utilizing the etched metal layer to act as a blocking base to remove the exposed regions of the first guard isolation layer and the second guard isolation layer above the metal layer.

In Step 214, as shown in FIG. 6A, the oxide-2 layer is grown in the first concave 122 and the second concave 124 to form the first guard isolation layer 1184 and the second guard isolation layer 1204, respectively. In Step 216, the metal layer (e.g. Tungsten-1) 602 is deposited into the first concave 122 and the second concave 124, respectively. In addition, the anisotropic etching technique is utilized to etch down the metal layer 602 inside the first concave 122 and the second concave 124 to a well-designed height to make a top of the metal layer 602 lower than the semiconductor surface 116. Then, as shown in FIG. 6B, the height of the etched metal layer 602 can act as a blocking base to make the exposed regions of the first guard isolation layer 1184 and the second guard isolation layer 1204 above the metal layer 602 be removed, such that the exposed silicon sidewall 702 of the first concave 122 and the exposed silicon sidewall 704 of the second concave 124 are formed.

Figure 6C:
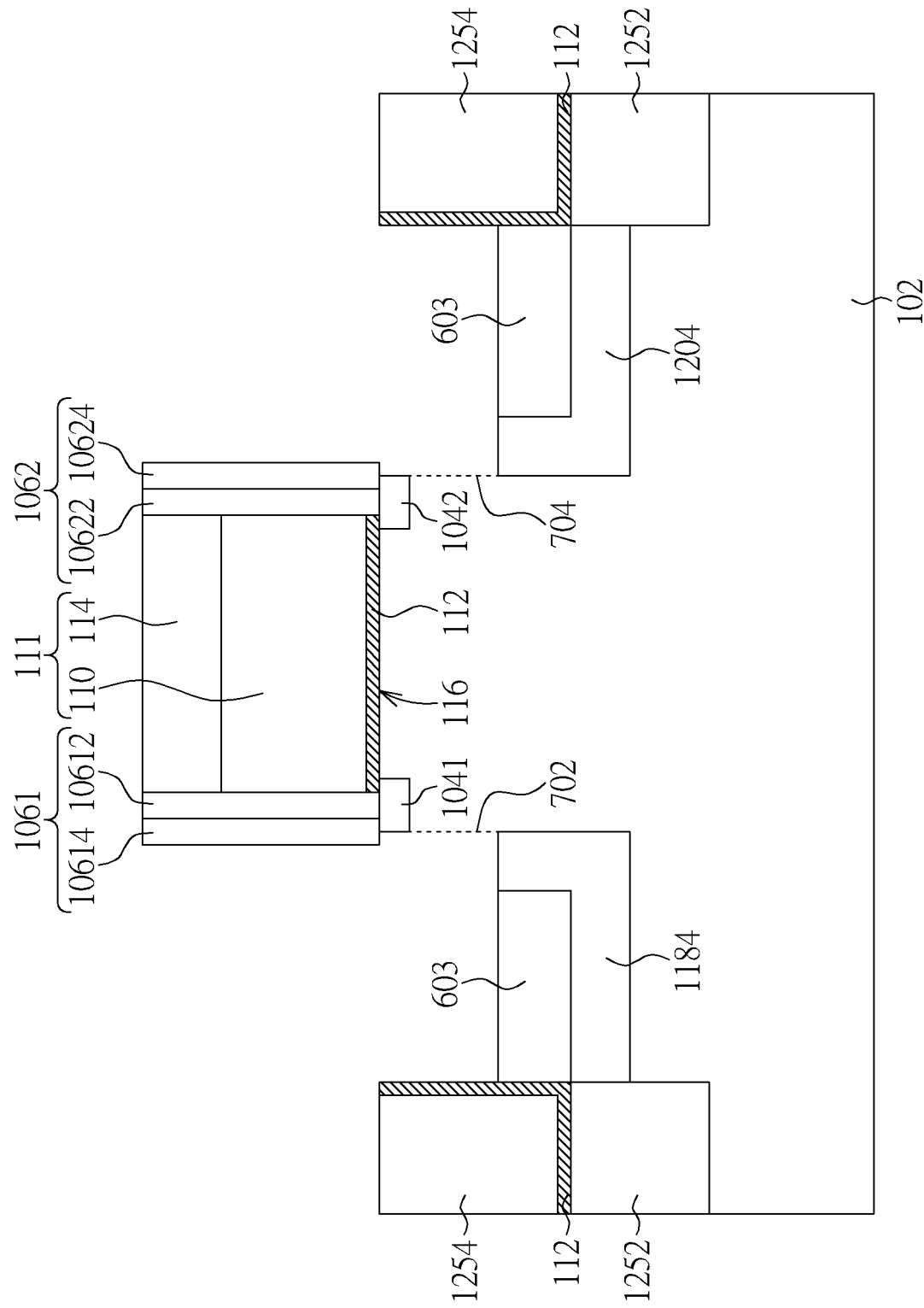
FIG. 6C is a diagram illustrating utilizing the dielectric material to act as a blocking base to remove the exposed regions of the first guard isolation layer and the second guard isolation layer above the metal layer.

Since the etched metal layer 602 acts as a blocking base to reveal the exposed silicon sidewall 702 and the exposed silicon sidewall 704, the etched metal layer in the abovementioned processes could be replaced by an dielectric material 603 (such as nitride), as shown in FIG. 6C. This dielectric material 603 would be treated as another isolation layer above the first guard isolation layer 1184 and the second guard isolation layer 1204.

Figure 7A:
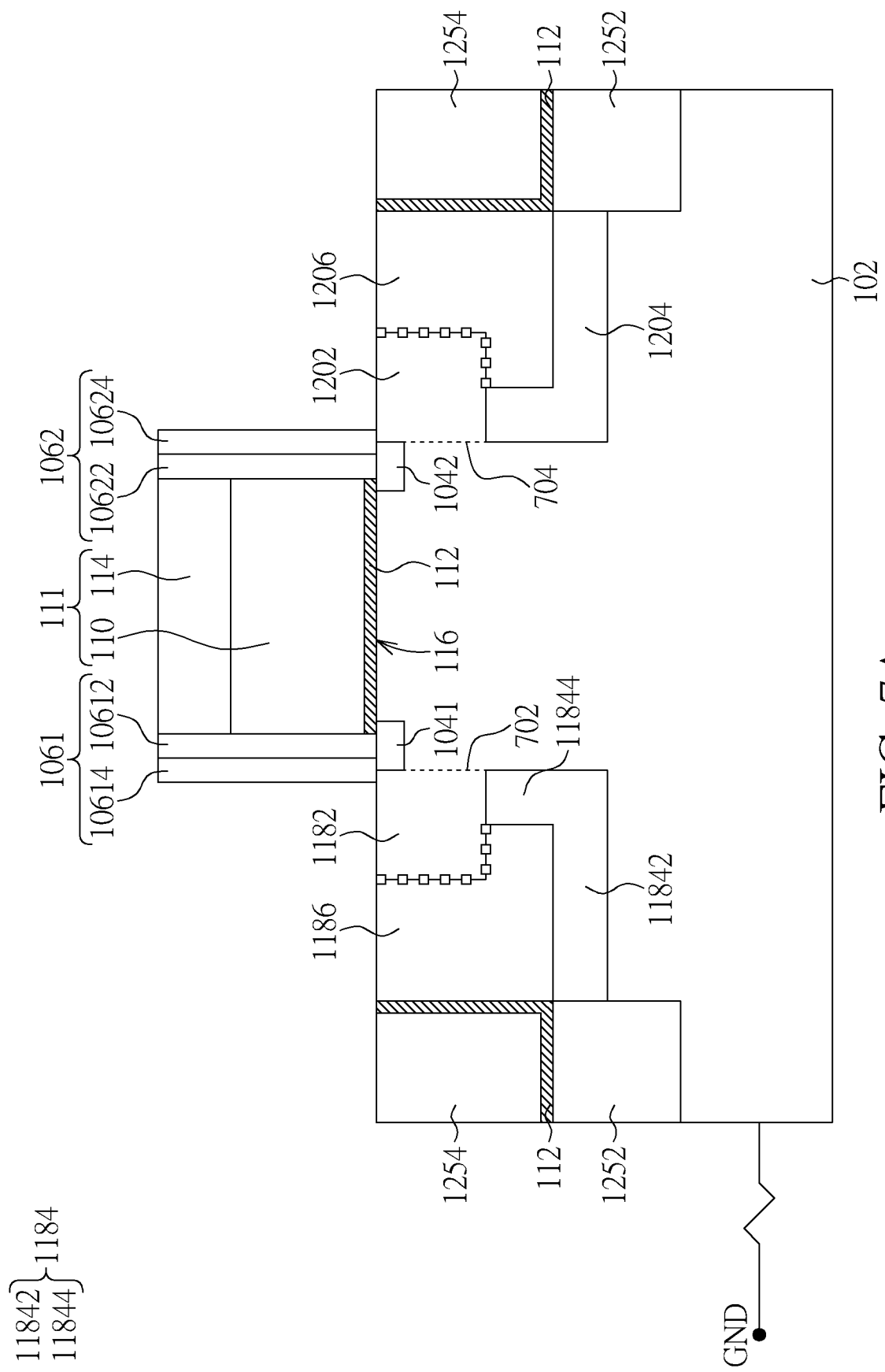
FIG. 7A is a diagram illustrating growing laterally the first semiconductor region and the second semiconductor region, removing the metal layer formed into the first concave and the second concave, and depositing the composite metal material (CMM).

In Step 218, as shown in FIG. 7A, by taking the exposed silicon sidewall 702 of the first concave 122 and the exposed silicon sidewall 704 of the second concave 124 as seeding materials (wherein the exposed silicon sidewall 702 and the exposed silicon sidewall 704 are below the semiconductor surface 116), a selective epitaxy growth (SEG) technique (or an atomic layer deposition (ALD) growth technique) is utilized to grow laterally the n+ in-situ doping first semiconductor region 1182 and the n+ in-situ doping second semiconductor region 1202 from the exposed silicon sidewall 702 and the exposed silicon sidewall 704 respectively, resulting in an n+ semiconductor junction existing between the first semiconductor region 1182 and the p-type substrate 102 and an n+ semiconductor junction existing between the second semiconductor region 1202 and the p-type substrate 102. In addition, the semiconductor process of growing the first semiconductor region 1182 (or the second semiconductor region 1202) is similar to the way of forming source electrode (or drain electrode), by ALD and/or SEG, except that a seeding source of growing silicon is from a bottom exposed silicon surface surrounded by shallow trench isolation structures.

Because the present invention grows laterally silicon electrodes, i.e. the first semiconductor region 1182 and the second semiconductor region 1202, based on exposed sidewalls of the p-type substrate for NMOS (or exposed sidewalls of the n-type substrate for PMOS), all the techniques of growing drain and source electrodes in the state-of the-art tri-gate, FinFET, GAA, or other fin-structure type transistor can be employed to the present invention, such as any strain related material or process can enhance a transistor mobility and speed, and later form a silicide layer into a top region of electrodes of the transistor to make the top region of the electrodes have a better interface with Ohmic contact, and so on.

In Step 220, as shown in FIG. 7A, the metal layer 602 formed into the first concave 122 and the second concave 124 could be removed. (In the event the metal layer 602 is replaced by the dielectric material 603 as shown in FIG. 6C, such dielectric material 603 may not be removed and acts as portion of guard isolation) Then, the layer of composite metal material (CMM) is deposited into the first concave 122 and the second concave 124, e.g. in one embodiment the composite metal material may include a silicide material covering the first/second semiconductor regions 1182/1202, a TiN buffer layer (kind of core metal column) covering the silicide material, and a Tungsten layer filling in the first/second concaves 122/124. The TiN buffer layer is deposited into the first concave 122 and the second concave 124 to provide good interface with the silicide layer on the sidewalls of the first semiconductor region 1182 and the second semiconductor region 1202, respectively, and subsequently the Tungsten-2 layer is deposited into the first concave 122 and the second concave 124. The composite metal material (CMM) could be the first metal containing region 1186 and the second metal containing region 1206, wherein the TiN buffer layer contacts to the silicide layer and the core metal column (CMC). In addition, the CMM is filled into not only the first concave 122 and the second concave 124 but also all vacancies above the first concave 122 and the second concave 124 and the anisotropic etching technique is utilized to remove some extra CMM until height of the CMM can be leveled up to the top of the semiconductor surface 116.

As shown in FIG. 7A and FIG. 3(b), one sidewall of the first metal containing region 1186 contacts to the first semiconductor region 1182, and other three sidewalls of the first metal containing region 1186 are isolated by the deep shallow trench isolation structure/the first guard isolation layer 1184; the bottom of the first metal containing region 1186 is isolated by the first guard isolation layer 1184 as well. Similarly, one sidewall of the second metal containing region 1206 contacts to the second semiconductor region 1202, and other three sidewalls of the second metal containing region 1206 are isolated by the deep shallow trench isolation structure/the second guard isolation layer 1204; a bottom of the second metal containing region 1206 is isolated by the second guard isolation layer 1204 as well. In addition, taking the first metal containing region 1186 and the first guard isolation layer 1184 as an example, as shown in FIG. 7A, the first guard isolation layer 1184 includes the horizontal guard isolation portion 11842 and the vertical guard isolation portion 11844, wherein the vertical guard isolation portion 11844 contacts to the sidewall of the first metal containing region 1186 and the bottom of the first semiconductor region 1182, and the horizontal guard isolation portion 11842 contacts to the bottom of the first metal containing region 1186. Therefore, the first metal containing region 1186 is prevented from directly contacting to the p-type substrate 102 by the first guard isolation layer 1184. In addition, as shown in FIG. 7A, because a top of the deep shallow trench isolation structure is up to the top of the semiconductor surface 116 or the top of the dielectric insulator 112, the deep shallow trench isolation structure can separate the NMOS transistor 100 from neighboring transistors.

Furthermore, taking the first metal containing region 1186, the first semiconductor region 1182, and the NLDD 1041 as an example, as shown in FIG. 7A, a vertical length of the first semiconductor region 1182 in touch with the NLDD 1041 can be adjusted as a design tradeoff for desirable requirements of parameters of the NMOS transistor 100, such as width of the gate layer 110, targeted allowable leakage-current magnitude including DIBL (drain Induced Barrier Lowering), drain-to-source sub-channel conduction current for somewhat deteriorated short-channel effect, drain (source)/substrate junction leakages, and so on. A top of the first metal containing region 1186 could be designed to have a metal landing pad (MLP) function for receiving the metal-1 interconnection with much reduced border edges of openings to the first semiconductor region 1182, which thus allows more tightened design rules on the metal-1 connection to the first semiconductor region 1182.

Figure 7B:
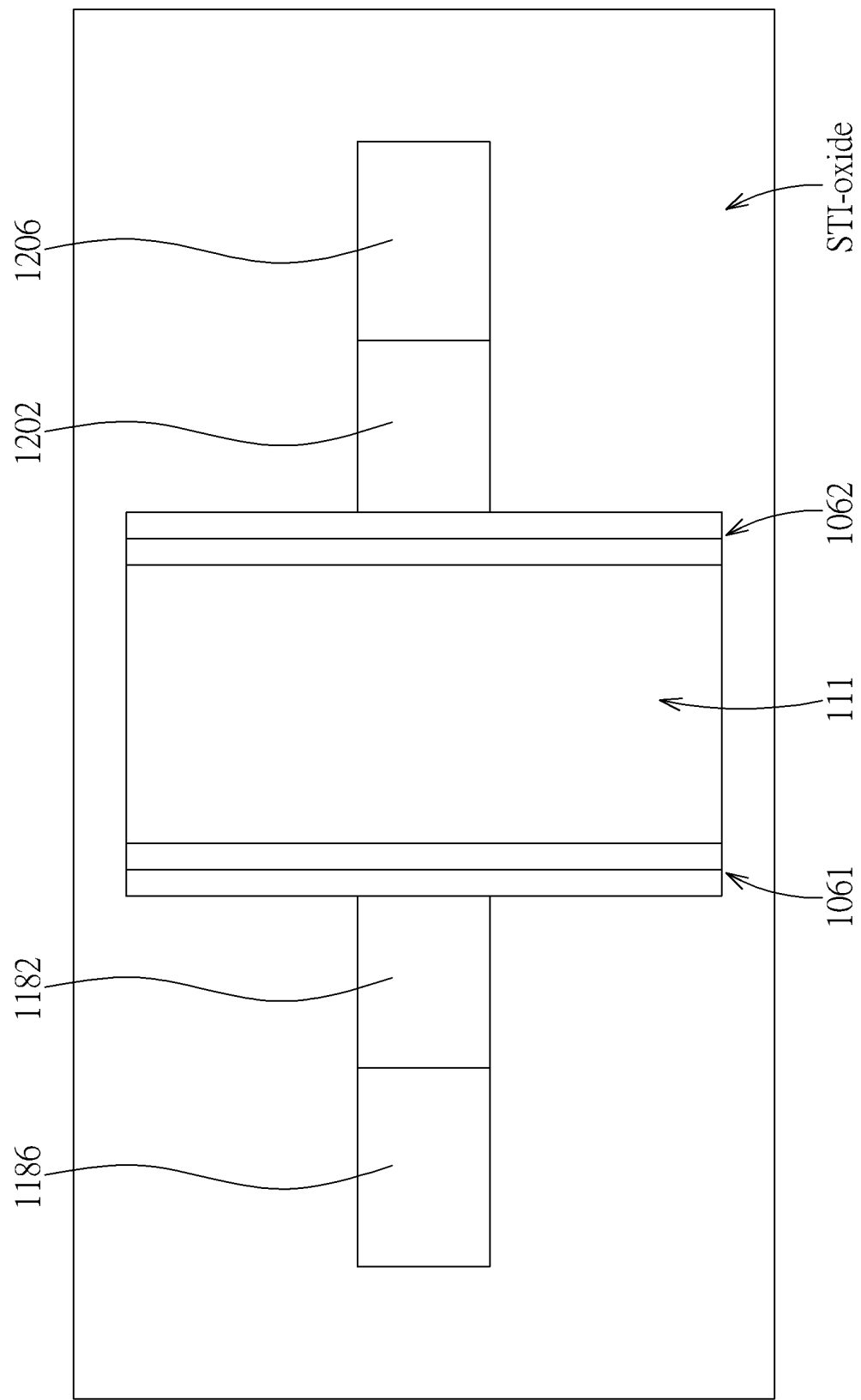
FIG. 7B is a top view of FIG. 7A when the SEG grown semiconductor and CMM are completed.

FIG. 7B is a top view of FIG. 7A after the SEG grown semiconductor and CMM are completed. As shown in FIG. 7B, the laterally grown n+ silicon (i.e. the first semiconductor region 1182) and CMM (i.e. the first metal containing region 1186) are formed in the rectangular first concave (not shown) and the laterally grown n+ silicon (i.e. the second semiconductor region 1202) and CMM (i.e. the second metal containing region 1206) are formed in the second concave (not shown), and the laterally grown n+ silicon and CMM are surrounded by STI oxide (i.e. the oxide layer 1252 and the oxide layer 1254).

Figure 7C:
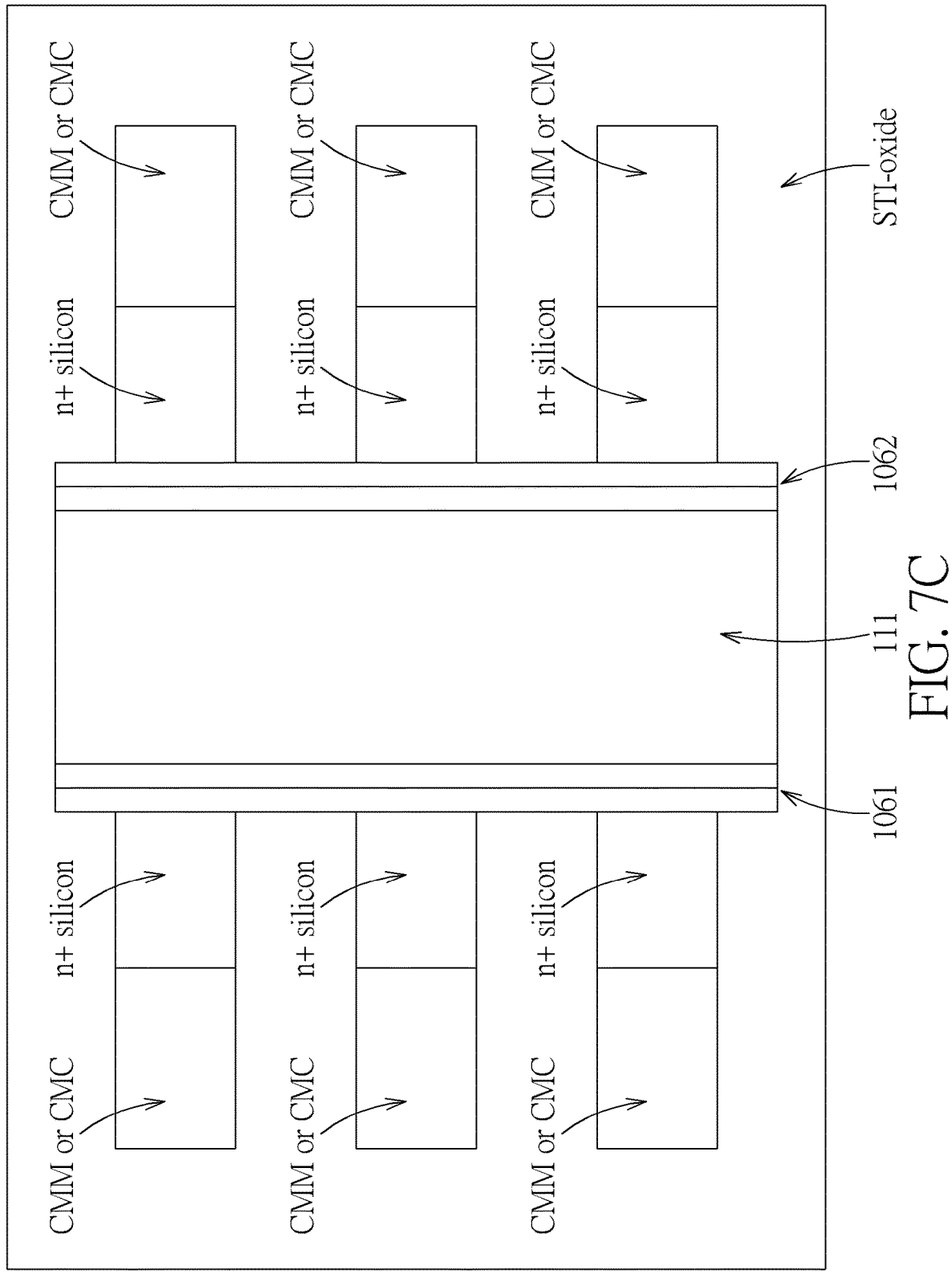
FIG. 7C is a top view of another embodiment of this invention in which a gate structure strides across or covers multiple fingers.

The aforesaid steps would be implemented for the fin-structure transistor produced under 12 nm (or lower) semiconductor manufacture processes. For example, as shown in FIG. 7C which is a top view of another embodiment of NMOS transistor according to this invention, multiple fingers are covered by a gate structure, and the width of each finger is 12 nm or lower. Left-hand side and right-hand side of each finger is still surrounded by STI oxide. The left-hand side (and the right-hand side) of each finger also includes laterally grown n+ silicon and CMM which are formed in rectangular concave. The bottom of the rectangular concave is covered by oxide (or thermal oxide) acting as guard isolation, and three sidewalls of the rectangular concave could be covered by the STI oxide as well.

Figure 7D:
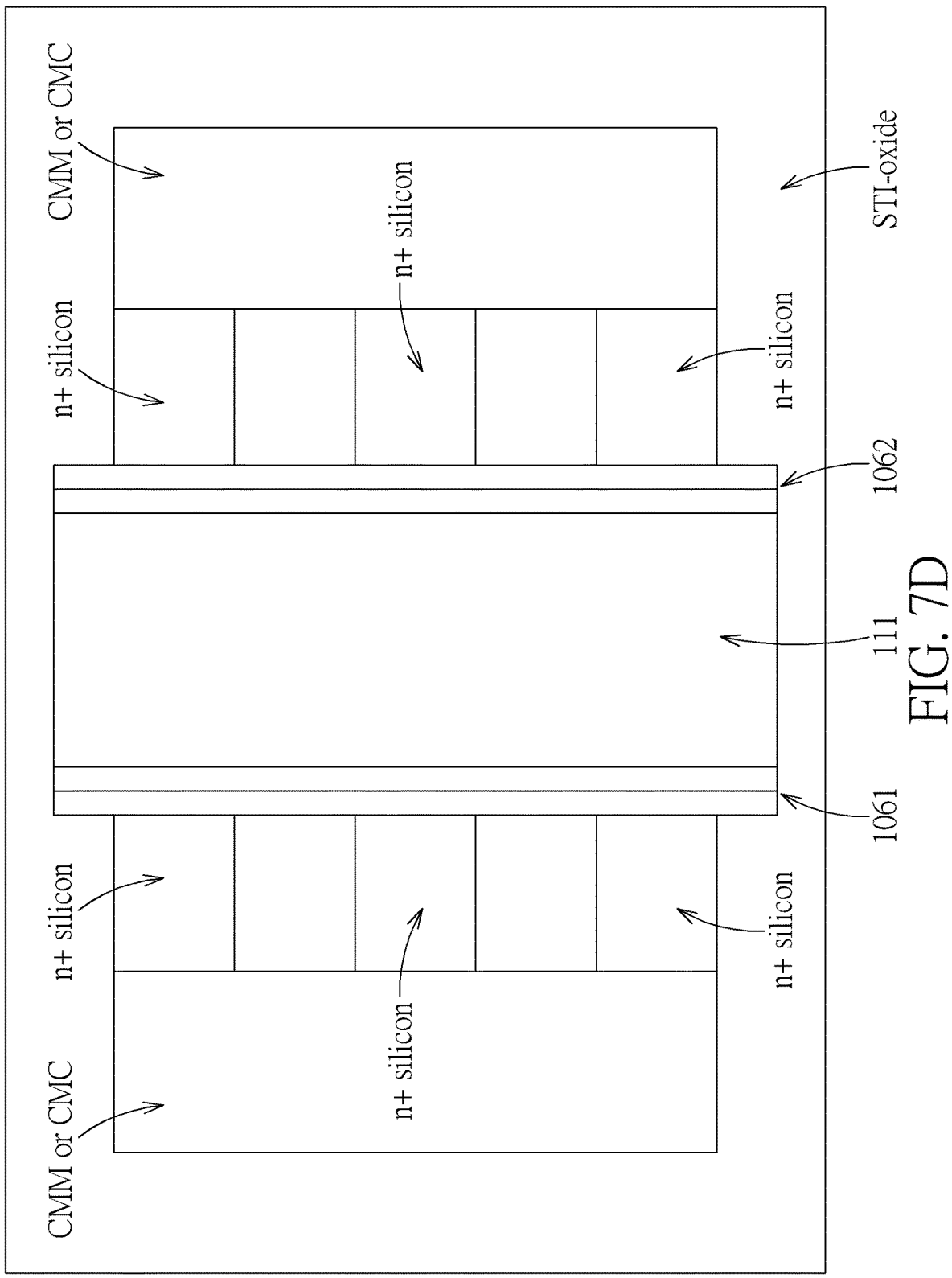
FIG. 7D is a top view of another embodiment of this invention in which a gate structure strides across or covers multiple fingers connected together.

Furthermore, FIG. 7D is a top view of another embodiment NMOS transistor according to this invention in which a gate structure strides across or covers multiple fingers and those fingers are connected together. Similar to FIG. 7C, the multiple fingers are also covered by a gate structure, and the left-hand side (and the right-hand side) of each finger includes laterally grown n+ silicon and CMM which are formed in a comb-shape concave (not shown). However, left-hand sides (or the right-hand sides) of those finger are connected together by the CMM when the CMM is formed in the comb-shape concave. The bottom of the comb-shape concave is covered by oxide acting as guard isolation, and all sidewalls (except the sidewall from which the n+ silicon is grown) could be covered by the STI oxide as well.

Figure 8:
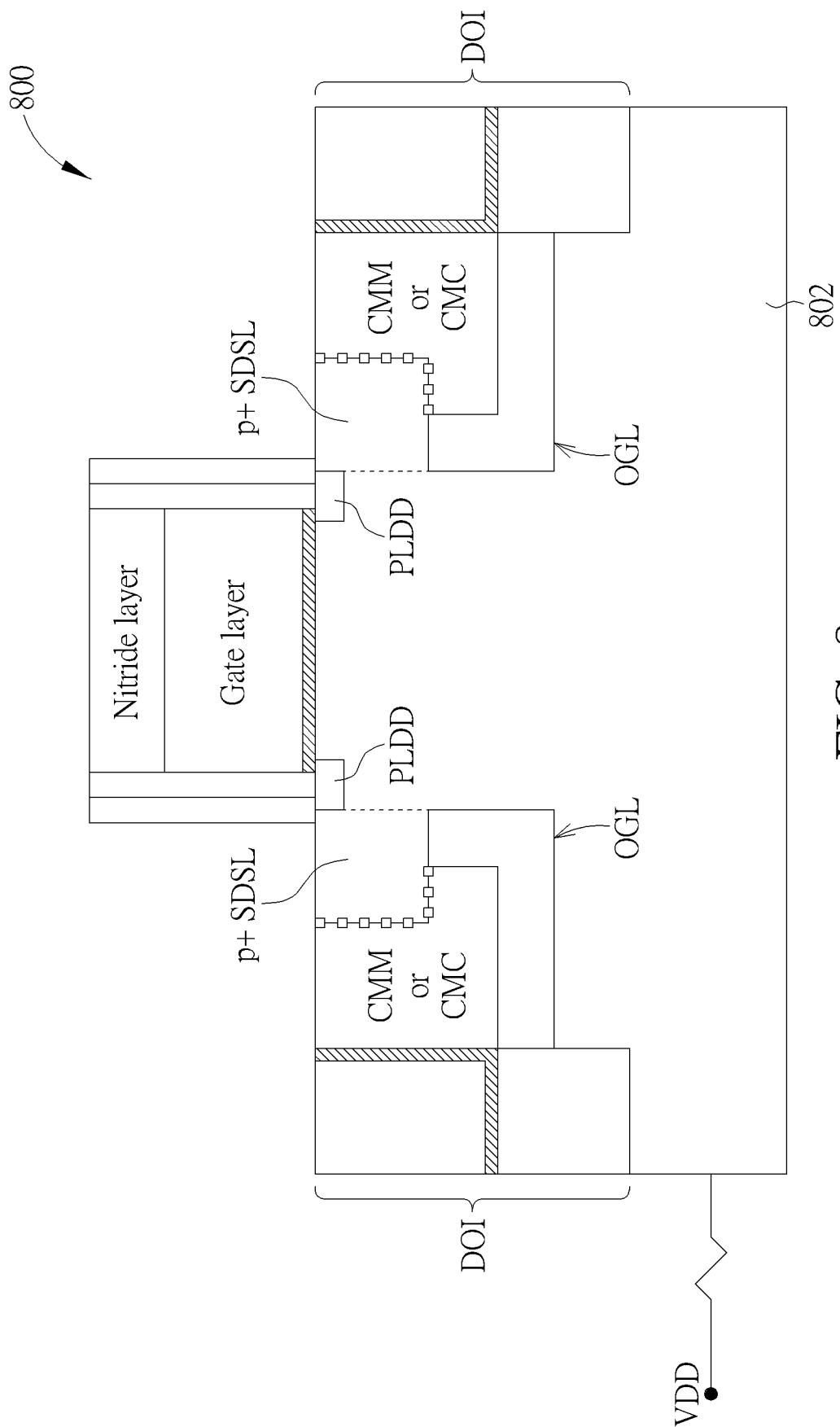
FIG. 8 is a diagram illustrating a structure of a PMOS transistor.

Similarly, the above-mentioned manufacturing Steps can be applied to manufacture a PMOS transistor 800 (as shown in FIG. 8), wherein n+ doping species (e.g. n+ SDSL)/n– doping species (e.g. NLDD) of the NMOS transistor in FIG. 7A are replaced with p+ doping species (e.g. p+ SDSL)/p– doping species (e.g. p-type lightly Doped drain, PLDD) of the PMOS transistor 800, the p-type substrate 102 of the NMOS transistor 100 is replaced with an n-well 802 of the PMOS transistor 800, and the ground GND connected to the p-type substrate 102 of the NMOS transistor 100 is replaced with a supply voltage VDD connected to the n-well 802.

(2) Two New Structures of NMOS and PMOS Transistors with Their Respective Substrates in a Complementary Metal Oxide Semiconductor (CMOS) Inverter The present invention creates new structures for both NMOS and PMOS transistors which have the new ways of connecting their source electrodes with their respective substrates effectively to result in significant improvements and enhancements of the CMOS inverter in term of performance, area, power, noise immunity, thermal dissipation, interconnection wiring complexity, power stability, yield, reliability, and quality.

Figure 9:
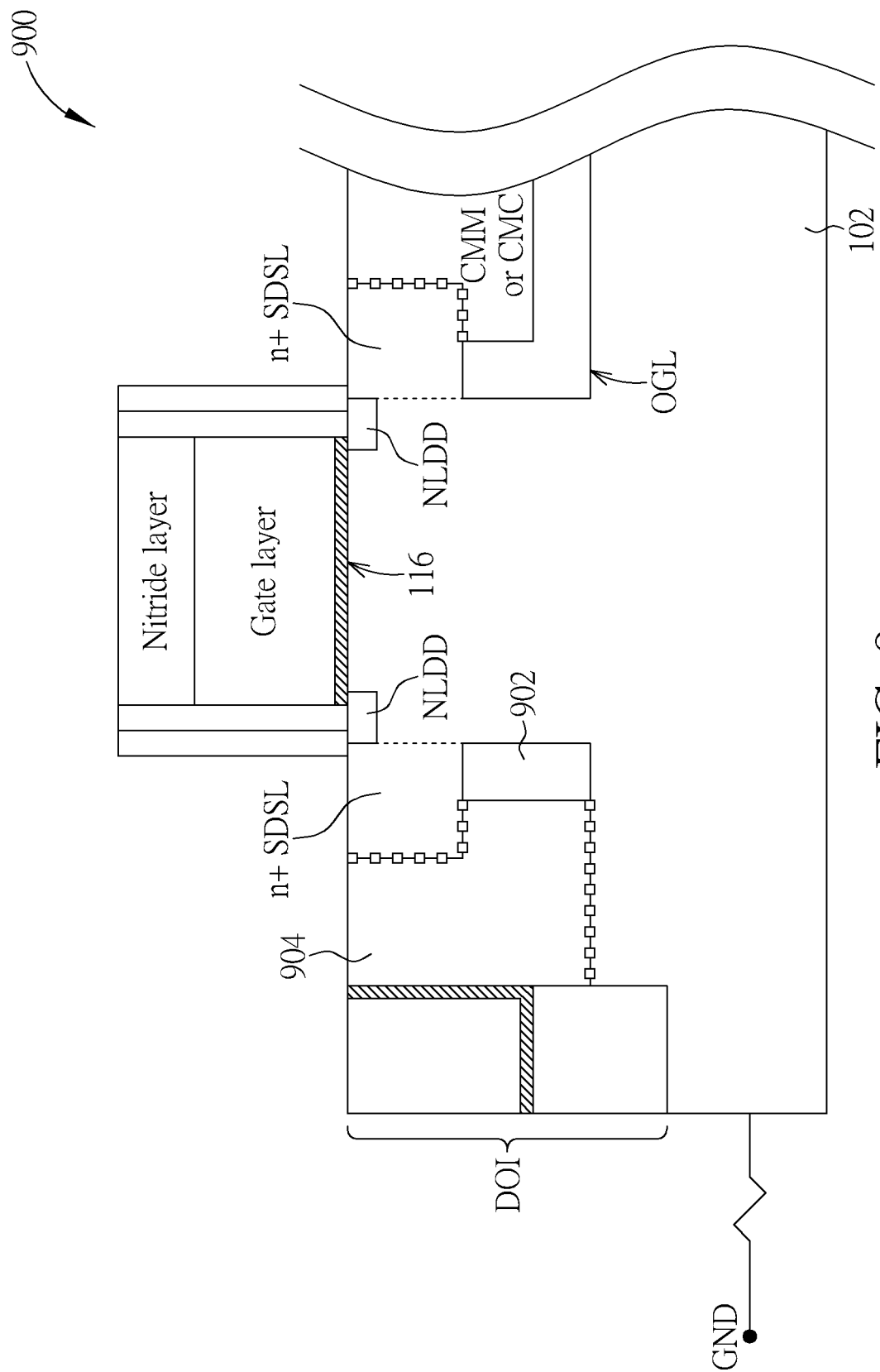
FIG. 9 is a diagram illustrating a structure of an NMOS transistor in a CMOS inverter according to a third embodiment of the present invention.

Please refer to FIG. 9. FIG. 9 is a diagram illustrating a structure of an NMOS transistor 900 in a CMOS inverter according to a third embodiment of the present invention. As shown in FIG. 9, a difference between the NMOS transistor 900 and the NMOS transistor 100 is that a first guard isolation layer 902 close to a CMM (or a CMC) 904 (i.e. the first metal containing region 1186 shown in the NMOS transistor 100) only includes a vertical guard isolation portion but without a horizontal guard isolation portion. The vertical guard isolation portion contacts to the bottom of the first semiconductor region 1182 and a sidewall of the CMM 904, and the CMM 904 directly contacts to the p-type substrate 102. Since both the CMM 904 and the p-type substrate 102 of the NMOS transistor 900 are connected to the ground GND (0 V electrical potential), the CMM 904 does not have a barrier of the first guard isolation layer 902 so as to make the CMM 904 directly electrically contact to the p-type substrate 102 which is also grounded (either supplied from metal pads connected to some external 0 V power supplies or directly supplied from the p-type substrate 102 which is directly grounded by a metal backside contact of the p-type substrate 102 to some grounded reference plane). The CMM 904 can realize a direct Ohmic contact to the p-type substrate 102 in contrast to a source structure provided by the prior art which must make a topside metal contact to an opened source diffusion area and then make a metal-1 connection on top of the silicon surface. As a result, a planar area of the NMOS transistor 900 can be significantly reduced in contrast to an NMOS transistor provided by the prior art requiring a much larger planar area for its source region. That is, the present invention has a significant advancement on a design of CMOS circuits, such as an inverter. In addition, the CMM (or the CMC) 904 and the p-type substrate 102 creates a direct path for supplying potential of the ground GND from a wide and stable substrate plane of the p-type substrate 102, so it means that the direct path has much lower impedance, resulting in noise (such as unexpected undershoot or overshoot signaling noises inherited in the prior art inferior grounded reference voltage design and possibly very noisy substrate operations) being significantly reduced.

Manufacturing process differences between the NMOS transistor 900 and the NMOS transistor 100 are described as follows: as shown in FIG. 6A, the oxide-2 layer is grown in the first concave 122 and the second concave 124; a photolithographic masking technique is utilized to only protect the oxide-2 layer grown in the second concave 124 but expose the oxide-2 layer grown in the first concave 122; the anisotropic etching technique is utilized to remove a horizontal guard isolation portion of the oxide-2 layer at the bottom of the first concave 122 but to reserve a vertical guard isolation portion of the oxide-2 layer faces to a sidewall of the first concave 122. In addition, other manufacturing steps of the NMOS transistor 900 are the same as those of the NMOS transistor 100, so further description thereof is omitted for simplicity.

Figure 10:
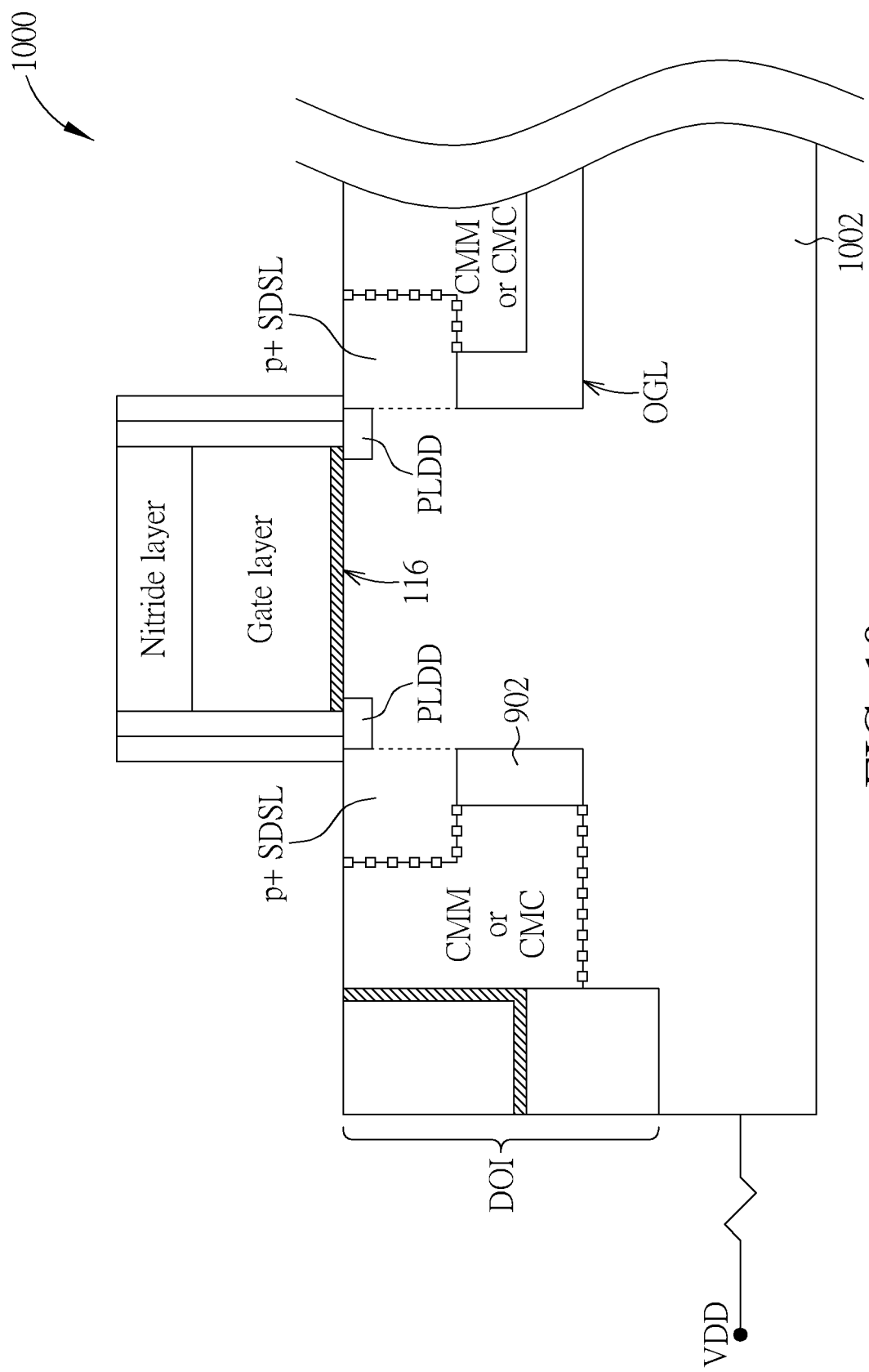
FIG. 10 is a diagram illustrating a structure of a PMOS transistor.

Similarly, the above-mentioned manufacturing steps of the NMOS transistor 900 can be applied to manufacture a PMOS transistor 1000 (as shown in FIG. 10), wherein n+/n– doping species (e.g. n+ SDSL, NLDD) of the NMOS transistor 900 are replaced with p+/p– doping species (e.g. p+ SDSL, PLDD) of the PMOS transistor 1000, the p-type substrate 102 of the NMOS transistor 900 is replaced with an n-well 1002 of the PMOS transistor 1000, and the ground GND connected to the p-type substrate 102 of the NMOS transistor 900 is replaced with a supply voltage VDD (e.g. 0.6V in a 7 nm CMOS technology) connected to the n-well 1002. Therefore, as shown in FIG. 10, because both a source electrode and the n-well 1002 of the PMOS transistor 1000 are directly connected to the supply voltage VDD, the source electrode (that is, the first conductive region 118 or the CMM portion) of the PMOS transistor 1000 can directly electrically contact to the n-well 1002, wherein the n-well 1002 has its electric potential (either supplied from metal pads connected to some external 0.6V power supplies or directly supplied from the n-well 1002 which can be connected to a 0.6 V electrical regulator).

Figure 11:
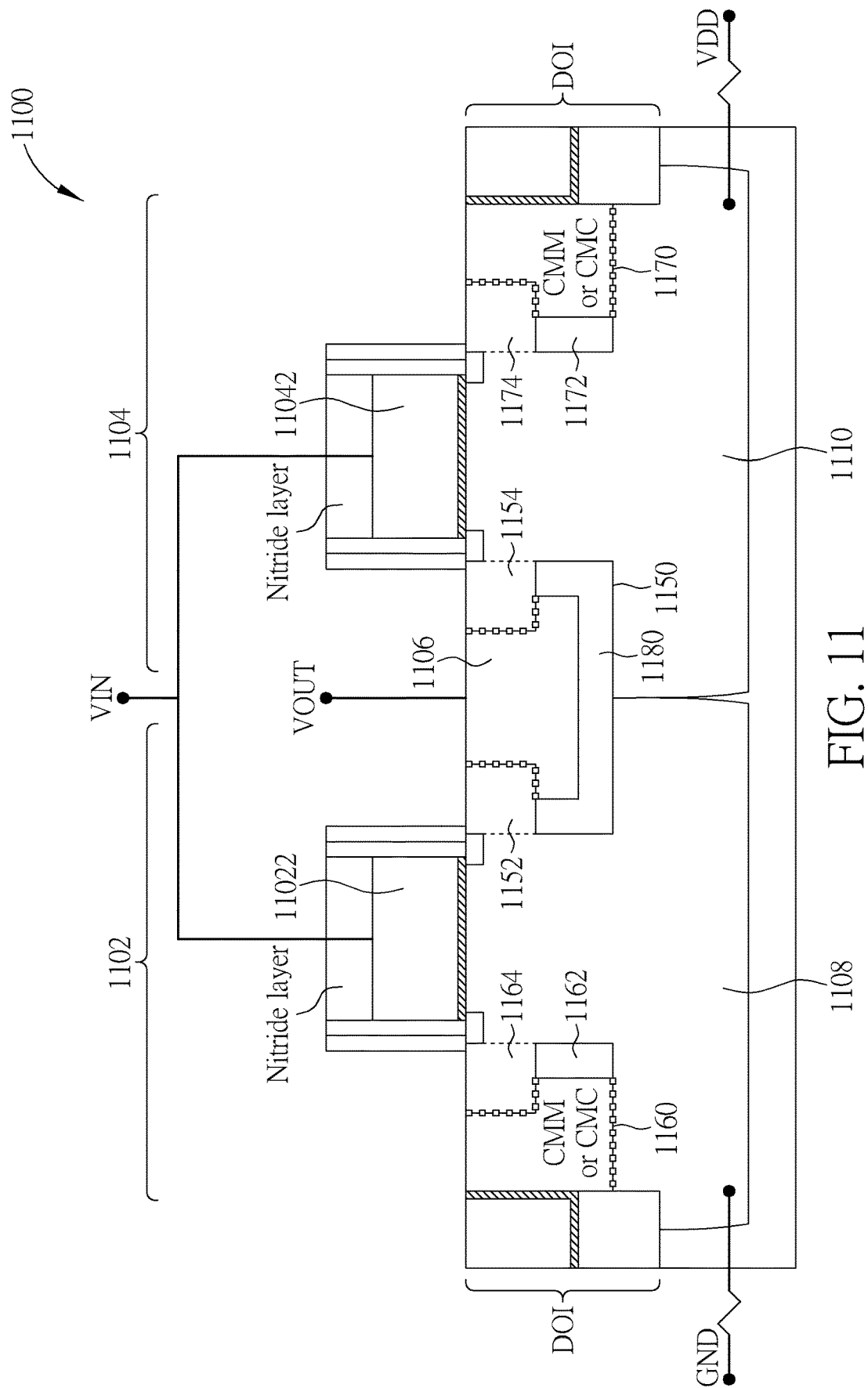
FIG. 11 is a diagram illustrating a cross-section of a CMOS inverter according to a fourth embodiment of the present invention.

(3) New Drain and Related Substrate/Well Structures for NMOS and PMOS Transistors in a CMOS Inverter Please refer to FIG. 11. FIG. 11 is a diagram illustrating a cross-section of a CMOS inverter 1100 according to a fourth embodiment of the present invention, wherein the CMOS inverter 1100 includes an NMOS transistor 1102 and a PMOS transistor 1104, a structure of the NMOS transistor 1102 can be referred to the NMOS transistor 900 shown in FIG. 9, and a structure of the PMOS transistor 1104 can be referred to the PMOS transistor 1000 shown in FIG. 10. As shown in FIG. 11, a first conductive region of the NMOS transistor 1102 is formed in a first concave 1150, a second conductive region of the NMOS transistor 1102 is formed in a second concave 1160, a third conductive region of the PMOS transistor 1104 is formed in the first concave 1150, and a fourth conductive region of the PMOS transistor 1104 is formed in a third concave 1170, wherein a first metal containing region included in the first conductive region of the NMOS transistor 1102 is electrically coupled to a first heavily doped n-type semiconductor region 1152 (n+ SDSL) which is included in the first conductive region of the NMOS transistor 1102, and is also electrically coupled to a third heavily doped p-type semiconductor region 1154 (p+ SDSL) included in the third conductive region of the PMOS transistor 1104.

In addition, as shown in FIG. 11, a first guard isolation layer 1180 is formed in the first concave 1150, the first guard isolation layer 1180 contacts to a bottom of the first heavily doped n-type semiconductor region 1152, contacts to a bottom of the third heavily doped p-type semiconductor region 1154, and contacts to a bottom and a sidewall of the first metal containing region of the first conductive region of the NMOS transistor 1102.

In addition, as shown in FIG. 11, a second guard isolation layer 1162 is formed in the second concave 1160, the second guard isolation layer 1162 contacts to a sidewall of a second metal containing region (or the CMM portion) included in the first conductive region of the NMOS transistor 1102, and further contacts to a bottom of a second heavily doped n-type semiconductor region 1164 (n+ SDSL) included in the first conductive region of the NMOS transistor 1102, wherein the second heavily doped n-type semiconductor region 1164 abuts to a p-well 1108.

In addition, as shown in FIG. 11, a third guard isolation layer 1172 is formed in the third concave 1170, the third guard isolation layer 1172 contacts to a sidewall of a fourth metal containing region (or the CMM portion) included in the fourth conductive region of the PMOS transistor 1104, and further contacts to a bottom of a fourth heavily doped p-type semiconductor region 1174 (p+ SDSL) included in the fourth conductive region of the PMOS transistor 1104, wherein the fourth heavily doped p-type semiconductor region 1174 abuts to the n-well 1110.

In addition, as shown in FIG. 11, a gate layer 11022 of the NMOS transistor 1102 and a gate layer 11042 of the PMOS transistor 1104 receive an input voltage VIN, a drain (the first conductive region) of the NMOS transistor 1102 and a drain (the third conductive region) of the PMOS transistor 1104 are merged together to act as a central connector 1106 to output an output voltage VOUT, wherein the central connector 1106 is designed between two opposite sidewalls, one sidewall of the two opposite sidewalls has a p+/n-well semiconductor junction (p+ silicon drain layer (SDL)) on an edge of the drain of the PMOS transistor 1104, another sidewall of the two opposite sidewalls has n+/p-well semiconductor junction (n+ SDL) on an edge of the drain of the NMOS transistor 1102, and the central connector 1106 is isolated from the p-well 1108 corresponding to the NMOS transistor 1102 and the n-well 1110 corresponding to the PMOS transistor 1104 by the first guard isolation layer 1180.

Furthermore, as shown in FIG. 11, the fourth metal containing region included in the fourth conductive region of the PMOS transistor 1104 is electrically coupled to the supply voltage VDD through the n-well 1110, and the second metal containing region included in the first conductive region of the NMOS transistor 1102 is electrically coupled to the ground GND through the p-well 1108.

Therefore, a separation required to be reserved between the n-well 1110 and the p-well 1108 can be narrowed down to even being directly abutted, resulting in latch-up possibility being diminished quite significantly. Because a metal contact is condensed on a common core metal column (CMC, i.e. the central connector 1106) or the composite metal material (CMM), interconnections between the drain of the PMOS transistor 1104 and the drain of the NMOS transistor 1102 is established simultaneously and perhaps should be stated like "synchronously". In addition, a structure of the common CMC bridging the drain of the NMOS transistor 1102 with the drain of the PMOS transistor 1104 can form a very compact connection under the semiconductor surface 116 by using the 3D space created inside the p-type substrate 102, thus greatly simplifying formation of the metal-1 interconnect which can be made as a direct contact to an opening on a top of the common core metal column (like a metal landing pad) so as to synchronously and simultaneously connect both the NMOS transistor 1102 and the PMOS transistor 1104 in the central connector 1106 for the CMOS inverter 1100.

Figure 12:
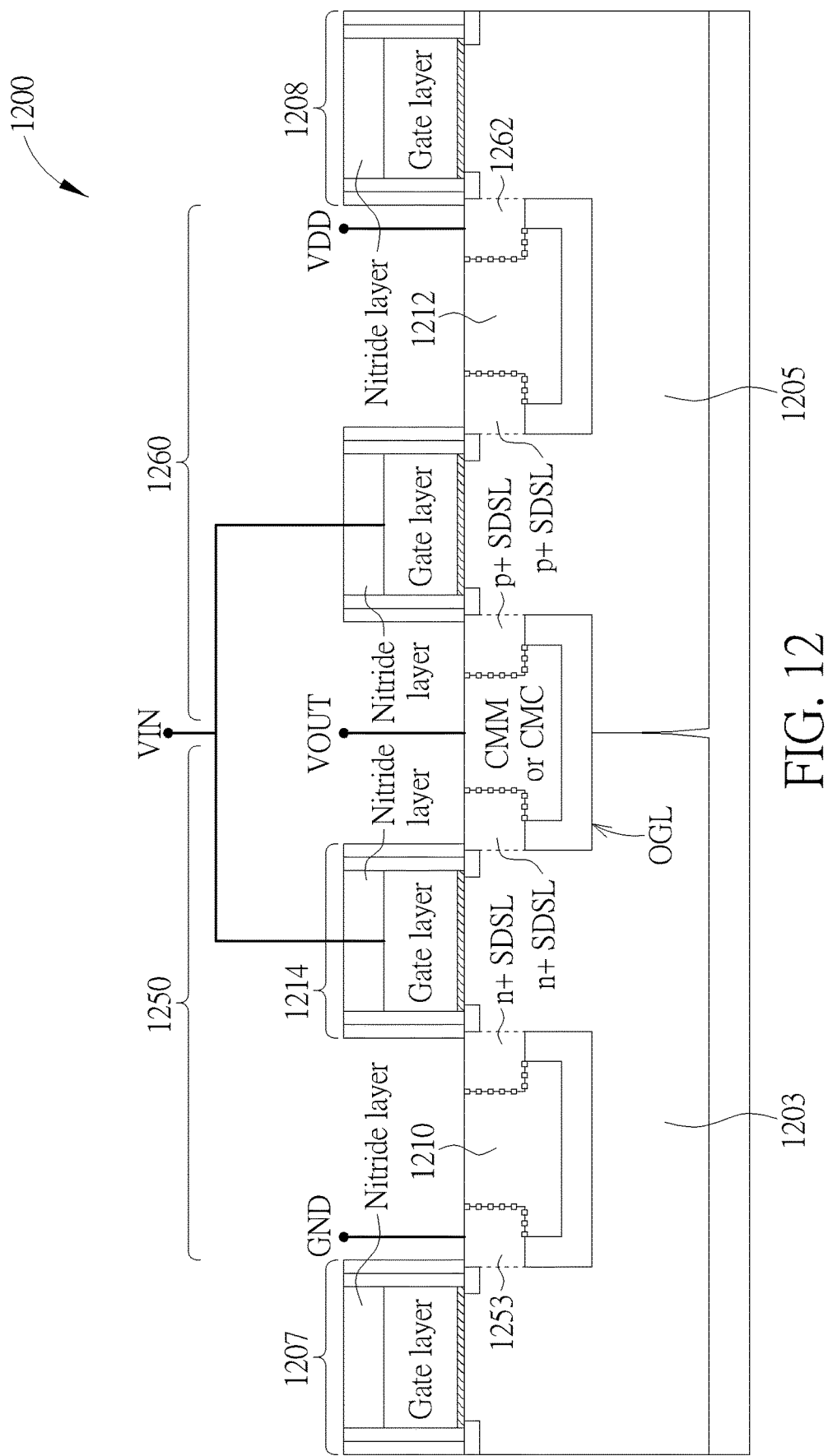
FIG. 12 is a diagram illustrating a cross-section of a CMOS inverter according to another embodiment of the present invention.

Please refer to FIG. 12. FIG. 12 is a diagram illustrating a cross-section of a CMOS inverter 1200 according to another embodiment of the present invention, wherein differences between the CMOS inverter 1100 and the CMOS inverter 1200 are shown in FIG. 12, and FIG. 12 shows one possible arrangement on how to connect the ground GND to a p-well 1203, such as through a p+ SDSL 1253 (sixth heavily doped p-type semiconductor region) or the CMM region 1210, and how to connect the supply voltage VDD to an n-well 1205, such as through an n+ SDSL 1262 (a fifth heavily doped n-type semiconductor region) or the CMM region 1212.

In addition, another difference between the CMOS inverter 1200 and the CMOS inverter 1100 is that the CMOS inverter 1200 includes dummy gate structures 1207, 1208, wherein the dummy gate structure 1207 can make height of the CMM region (or CMC portion) 1210 of an NMOS 1250 higher than height of the region (or CMC portion) of the NMOS 1102 because the CMM region 1210 of the NMOS 1250 can be formed between the dummy gate structure 1207 and a gate structures 1214 of the NMOS 1250. In addition, the dummy gate structure 1208 can make height of the CMM region 1212 of a PMOS 1260 higher than height of a CMM region of the PMOS 1104.

Figure 13:
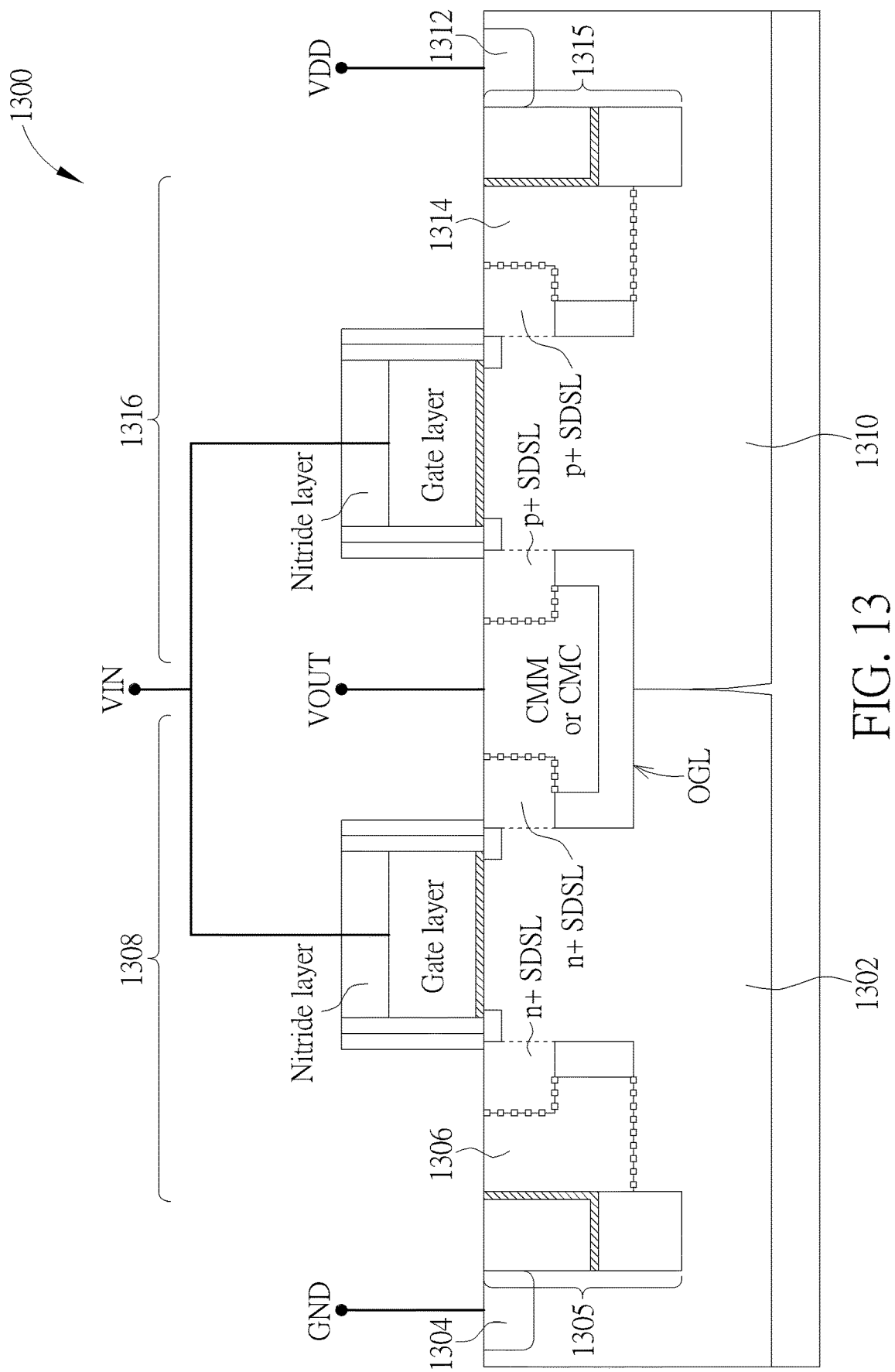
FIG. 13 is a diagram illustrating a cross-section of a CMOS inverter according to another embodiment of the present invention.

Please refer to FIG. 13. FIG. 13 is a diagram illustrating a cross-section of a CMOS inverter 1300 according to another embodiment of the present invention, wherein FIG. 13 shows one possible arrangement on how to connect the ground GND to a p-well 1302 through a p+ semiconductor zone 1304 which is under the semiconductor surface 116 and separated from a CMM (or CMC) 1306 of an NMOS transistor 1308 by a deep shallow trench isolation structure 1305 (that is, STI-oxide), and how to connect the supply voltage VDD to an n-well 1310 through an n+ semiconductor zone 1312 which is under the semiconductor surface 116 and separated from a CMC (or CMM) 1314 of a PMOS transistor 1316 by a deep shallow trench isolation structure 1315.

Figure 14A:
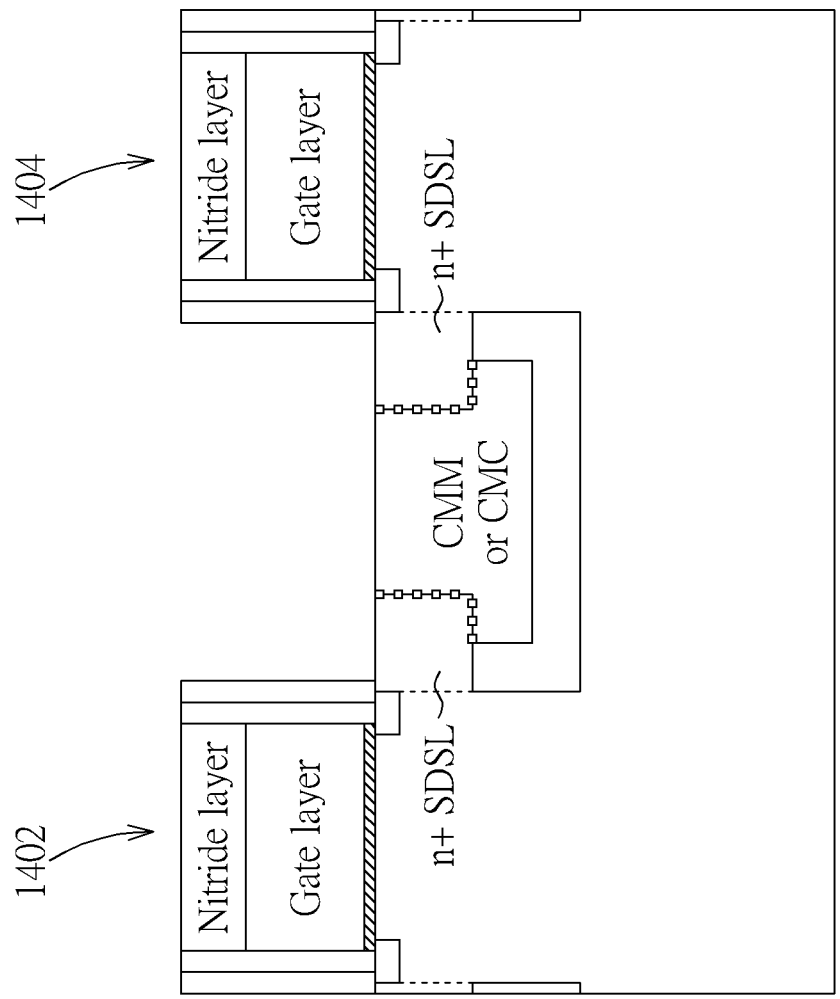
FIGS. 14A, 14B are diagrams illustrating two more possible ways of connecting transistors in different circuit configurations.
Figure 14B:
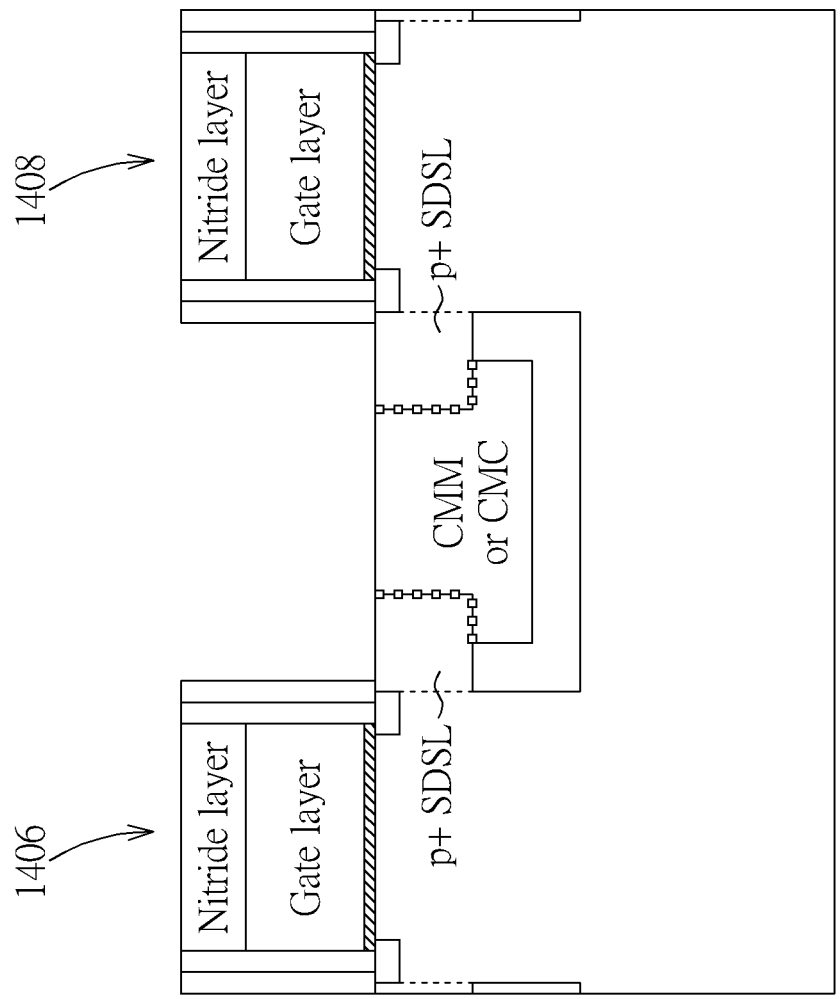

Please refer to FIGS. 14A, 14B. FIGS. 14A, 14B are diagrams illustrating two more possible ways of connecting transistors in different circuit configurations, wherein FIG. 14A shows a connection of an NMOS transistor 1402 to another NMOS transistor 1404 and FIG. 14B shows a connection of a PMOS transistor 1406 to another PMOS transistor 1408.

To sum up, because the NMOS transistor and the PMOS transistor provided by the present invention include merged semiconductor-junction and metal-connection (MSMC)

structures, compared to the prior art, the present invention can reduce complexity of multiple layers of interconnections of new networks of CMOS circuits composed of the NMOS transistors and the PMOS transistors, enhance speed performance of the CMOS circuits, reduce power and an area of the CMOS circuits, create more and better paths of the CMOS circuits for thermal dissipation, and increase immunities to noises associated with operations of the CMOS circuits.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transistor structure comprising:
   a semiconductor substrate with a semiconductor surface;
   a gate structure;
   a channel region comprising a first terminal and a second terminal; and
   a first conductive region electrically coupled to the first terminal of the channel region, and the first conductive region comprising a first metal containing region and a first semiconductor region, wherein the first metal containing region and the first semiconductor region are within a first trench, wherein a most lateral edge of the first semiconductor region directly contacts to one sidewall of the first metal containing region, and another sidewall of the first metal containing region contacts to one edge of the first trench.

2. The transistor structure in claim 1, wherein the first semiconductor region is under the semiconductor surface.

3. The transistor structure in claim 2, wherein the first metal containing region comprises a metal column.

4. The transistor structure in claim 3, wherein the first metal containing region further comprises:
   a silicide layer abutting to the first semiconductor region; and
   a buffer layer contacting to the silicide layer and the metal column.

5. The transistor structure in claim 2, further comprising:
   a guard isolation layer contacting to the first metal containing region, wherein the guard isolation layer prevents the first metal containing region from contacting to the semiconductor substrate.

6. The transistor structure in claim 2, wherein the guard isolation layer contacts to a bottom of the first metal containing region.

7. The transistor structure in claim 6, further comprising:
   a trench isolation layer below the semiconductor surface, wherein the trench isolation layer covers a plurality of sidewalls of the first metal containing region.

8. The transistor structure in claim 2, further comprising:
   a second conductive region electrically coupled to the second terminal of the channel region, wherein the second conductive region comprises:
      a second metal containing region under the semiconductor surface; and
      a second semiconductor region under the semiconductor surface, and the second semiconductor region contacting to the second metal containing region.

9. The transistor structure in claim 8, further comprising:
   a guard isolation layer contacting to the second metal containing region, wherein the guard isolation layer prevents the second metal containing region from contacting to the semiconductor substrate.

10. The transistor structure in claim 9, wherein the guard isolation layer comprising:
    a horizontal guard isolation portion contacting to a bottom of the second metal containing region; and
    a vertical guard isolation portion contacting to a sidewall of the second metal containing region.

11. The transistor structure in claim 10, wherein the vertical guard isolation portion further contacting to a bottom of the second semiconductor region.

12. The transistor structure in claim 8, wherein the second metal containing region contacts to the semiconductor substrate.

13. The transistor structure in claim 1, wherein a top of the first semiconductor region and a top of the first metal containing region are contacted by a metal interconnection.

14. The transistor structure in claim 13, wherein the first semiconductor region is a first heavily doped n-type semiconductor region, and the transistor structure comprises:
    a spacer covering a sidewall of the gate structure, wherein the channel region comprises a first n-type lighted-doped region under the spacer, and the first n-type lighted-doped region abuts to the first heavily doped n-type semiconductor region.

15. The transistor structure in claim 2, wherein the first semiconductor region is a first heavily doped p-type semiconductor region.

16. The transistor structure in claim 15, further comprising:
    a spacer covering a sidewall of the gate structure, wherein the channel region comprises a first p-type lighted-doped-region under the spacer, and the first p-type lighted-doped-region abuts to the first heavily doped p-type semiconductor region.

17. A transistor structure comprising:
    a semiconductor substrate with a semiconductor surface;
    a first trench and a second trench in the semiconductor substrate;
    a gate structure;
    a channel region comprising a first terminal and a second terminal;
    a first conductive region coupled to the first terminal of the channel region, the first conductive region comprising a first metal containing region in the first trench and a first heavily doped semiconductor region in the first trench, wherein an L-shape first guard isolation layer comprising a horizontal guard isolation layer and a vertical guard isolation layer is under the first conductive region; and
    a second conductive region coupled to the second terminal of the channel region, the second conductive region comprising a second metal containing region in the second trench and a second heavily doped semiconductor region in the second trench.

18. The transistor structure in claim 17, further comprising:
    a second guard isolation layer contacting to a bottom of the second metal containing region, wherein the second guard isolation layer prevents the second metal containing region from contacting the semiconductor substrate;
    wherein the L-shape first guard isolation layer contacts to a bottom of the first metal containing region, and the L-shape first guard isolation layer prevents the first metal containing region from contacting the semiconductor substrate.

19. The transistor structure in claim 17, wherein the L-shape first guard isolation layer contacts to a bottom of the first metal containing region, and the L-shape first guard isolation layer prevents the first metal containing region from contacting the semiconductor substrate; wherein the second metal containing region contacts to the semiconductor substrate.

20. A set of transistors forming an inverter, comprising:
a semiconductor substrate with a semiconductor surface;
a first trench, a second trench, and a third trench, wherein the first trench, the second trench and the third trench surface are under the semiconductor surface;
an NMOS transistor structure comprising:
  a gate structure;
  a first conductive region, the first conductive region comprising a first metal containing region in the first trench and a first heavily doped n-type semiconductor region in the first trench; and
  a second conductive region, the second conductive region comprising a second metal containing region in the second trench and a second heavily doped n-type semiconductor region in the second trench; and
a PMOS transistor structure comprising:
  a gate structure;
  a third conductive region, the third conductive region comprising a third heavily doped p-type semiconductor region in the first-trench; and
  a fourth conductive region, the fourth conductive region comprising a fourth metal containing region in the third trench and a fourth heavily doped p-type semiconductor region in the third trench;
  wherein the first metal containing region is electrically coupled to the first heavily doped n-type semiconductor region and electrically coupled to the third heavily doped p-type semiconductor region.

21. The set of transistors in claim 20, further comprising:
a first guard isolation layer in the first trench, the first guard isolation layer contacting to a bottom of the first heavily doped n-type semiconductor region and contacting to a bottom of the third heavily doped p-type semiconductor region;
wherein the first guard isolation layer contacts to a bottom of the first metal containing region and contacts to a sidewall of the first metal containing region.

22. The set of transistors in claim 20, further comprising:
a second guard isolation layer in the second trench, the second guard isolation layer contacting to a sidewall of the second metal containing region, and the second guard isolation layer further contacting to a bottom of the second heavily doped n-type semiconductor region; and
a third guard isolation layer in the third trench, the third guard isolation layer contacting to a sidewall of the fourth metal containing region, and the third guard isolation layer further contacting to a bottom of the fourth heavily doped p-type semiconductor region;
wherein the semiconductor substrate comprises a p-well and a n-well, the second heavily doped n-type semiconductor region abuts to the p-well, and the fourth heavily doped p-type semiconductor region abuts to the n-well.

23. The set of transistors in claim 20, wherein the semiconductor substrate comprises a p-well and an n-well, the fourth metal containing region is electrically coupled to a high voltage source through the n-well, and the second metal containing region is electrically coupled to a low voltage source through the p-well.

24. The set of transistors in claim 20, further comprising:
a fifth heavily doped n-type semiconductor region in the third trench and contacting to the fourth metal containing region; and
a sixth heavily doped p-type semiconductor region in the second trench and contacting to the second metal containing region;
wherein a high voltage source contacts to the fifth heavily doped n-type semiconductor region, and a low voltage source contacts to the sixth heavily doped p-type semiconductor region.

25. A set of transistors comprising:
a semiconductor substrate with a semiconductor surface;
a first trench, a second trench, and a third trench, wherein the first trench, the second trench and the third trench are under the semiconductor surface;
a first transistor structure comprising:
  a gate structure;
  a first conductive region, the first conductive region comprising a first metal containing region in the first trench and a first heavily doped semiconductor region in the first trench; and
  a second conductive region, the second conductive region comprising a second metal containing region in the second trench and a second heavily doped semiconductor region in the second trench; and
a second transistor structure comprising:
  a gate structure;
  a third conductive region, the third conductive region comprising a third heavily doped semiconductor region in the first trench; and
  a fourth conductive region, the fourth conductive region comprising a fourth metal containing region in the third trench and a fourth heavily doped semiconductor region in the third trench; and
wherein the first metal containing region is electrically coupled to the first heavily doped semiconductor region and electrically coupled to the third heavily doped semiconductor region.

26. The set of transistors in claim 25, further comprising:
a first guard isolation layer configured in the first trench and contacting to the first metal containing region, wherein the first guard isolation layer prevents the first metal containing region from contacting the semiconductor substrate.

27. The set of transistors in claim 26, wherein the second metal containing region contacts to the semiconductor substrate, and the fourth metal containing region contacts to the semiconductor substrate.

28. A transistor structure comprising:
a semiconductor substrate with a semiconductor surface;
a first channel region comprising a first terminal and a second terminal;
a second channel region comprising a third terminal and a fourth terminal;
a gate structure across the first channel region and the second channel region;
a first conductive region electrically coupled to the first terminal of the first channel region, and the first conductive region comprising a metal containing region under the semiconductor surface; and
a third conductive region electrically coupled to the third terminal of the second channel region, and the third conductive region comprising the metal containing region under the semiconductor surface;
wherein the first conductive region and the third conductive region are electrically coupled, and a U-shape guard isolation layer comprising a horizontal guard isolation layer and two vertical guard isolation layers is under the first conductive region and the third conductive region.

29. The transistor structure in claim 28, wherein the first conductive region further comprises a first semiconductor region under the semiconductor surface, and the first semiconductor region contacts to the metal containing region and is coupled to the first terminal of the first channel region; wherein the third conductive region further comprises a third semiconductor region under the semiconductor surface, and the third semiconductor region contacts to the metal containing region and is coupled to the third terminal of the second channel region.

30. The transistor structure in claim 29, wherein the U-shape guard isolation layer is under the metal containing region, and the U-shape guard isolation layer prevents the metal containing region from contacting to the semiconductor substrate.

* * * * *